(12) United States Patent
Choi et al.

(10) Patent No.: US 11,398,392 B2
(45) Date of Patent: Jul. 26, 2022

(54) INTEGRATED CIRCUIT DEVICE AND METHOD OF MANUFACTURING THE SAME

(71) Applicant: Samsung Electronics Co., Ltd., Suwon-si (KR)

(72) Inventors: Byoungdeog Choi, Suwon-si (KR); Dongyoung Kim, Pohang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 242 days.

(21) Appl. No.: 16/882,494

(22) Filed: May 24, 2020

(65) Prior Publication Data

US 2021/0118705 A1 Apr. 22, 2021

(30) Foreign Application Priority Data

Oct. 22, 2019 (KR) .................. 10-2019-0131687

(51) Int. Cl.
| | |
|---|---|
| *H01L 27/108* | (2006.01) |
| *H01L 21/67* | (2006.01) |
| *H01L 21/768* | (2006.01) |
| *H01L 21/02* | (2006.01) |

(52) U.S. Cl.
CPC .... *H01L 21/67075* (2013.01); *H01L 21/0228* (2013.01); *H01L 21/76868* (2013.01)

(58) Field of Classification Search
CPC ......... H01L 27/10835; H01L 27/10852; H01L 27/10808; H01L 27/10858; H01L 27/10867; H01L 28/40–92; H01L 28/82–92
See application file for complete search history.

(56) References Cited

U.S. PATENT DOCUMENTS

| | | | |
|---|---|---|---|
| 7,723,183 B2 | 5/2010 | Cho et al. | |
| 7,736,987 B2 | 6/2010 | Manning et al. | |
| 8,154,064 B2 | 4/2012 | Manning et al. | |
| 8,519,463 B2 | 8/2013 | Manning et al. | |
| 9,287,349 B2 | 3/2016 | Kim et al. | |
| 9,520,459 B2 | 12/2016 | Cho et al. | |
| 9,917,147 B2 * | 3/2018 | Lee | .......... H01L 28/90 |
| 10,685,877 B2 * | 6/2020 | Kim | .......... H01L 28/90 |
| 10,910,382 B2 * | 2/2021 | Kim | .......... H01L 28/90 |
| 2006/0263971 A1 | 11/2006 | Lee et al. | |
| 2008/0042182 A1 * | 2/2008 | Park | .......... H01L 28/91 |
| | | | 257/E29.345 |

(Continued)

*Primary Examiner* — Jarrett J Stark

(74) *Attorney, Agent, or Firm* — Muir Patent Law, PLLC

(57) ABSTRACT

An integrated circuit (IC) device includes a lower electrode including a main portion having a sidewall with at least one step portion, and a top portion having a width less than that of the main portion in a lateral direction. An upper support pattern contacts the top portion of the lower electrode. The upper support pattern includes a seam portion. To manufacture an IC device, a mold pattern and an upper sacrificial support pattern through which a plurality of holes pass are formed on a substrate. A plurality of lower electrodes are formed inside the plurality of holes. A peripheral space is formed on the mold pattern. An enlarged peripheral space is formed by reducing a width and a height of the top portion. An upper support pattern is formed to fill the enlarged peripheral space.

20 Claims, 39 Drawing Sheets

(56) References Cited

U.S. PATENT DOCUMENTS

| | | | |
|---|---|---|---|
| 2009/0212338 A1* | 8/2009 | Benson | H01L 28/91 257/306 |
| 2010/0012989 A1* | 1/2010 | Lee | H01L 27/10852 438/585 |
| 2010/0261331 A1* | 10/2010 | Manning | H01L 27/101 438/386 |
| 2011/0062552 A1 | 3/2011 | Tsuchiya | |
| 2013/0147048 A1* | 6/2013 | Kuh | H01L 27/10814 257/768 |

* cited by examiner

INTEGRATED CIRCUIT DEVICE AND METHOD OF MANUFACTURING THE SAME

CROSS-REFERENCE TO RELATED APPLICATION

This application claims the benefit of Korean Patent Application No. 10-2019-0131687, filed on Oct. 22, 2019, in the Korean Intellectual Property Office, the disclosure of which is incorporated herein in its entirety by reference.

BACKGROUND

The inventive concept relates to an integrated circuit (IC) device, and more particularly, to an IC device including a capacitor and a method of manufacturing the IC device.

Due to the development of electronic technology, the downscaling of IC devices has rapidly progressed, and thus, patterns included in electronic devices have been miniaturized. Accordingly, with regard to capacitors having miniaturized sizes, there is an increased desire to develop structures capable of maintaining desired electrical characteristics while improving the capacitances thereof.

SUMMARY

The inventive concept provides an integrated circuit (IC) device configured to inhibit failures due to a bridge phenomenon between adjacent lower electrodes and have improved reliability even when an aspect ratio of a plurality of lower electrodes included in a plurality of capacitors becomes relatively high and a distance between the respective lower electrodes is reduced.

The inventive concept also provides a method of manufacturing an IC device, which may inhibit failures due to a bridge phenomenon between adjacent lower electrodes and have improved reliability even when an aspect ratio of a plurality of lower electrodes included in a plurality of capacitors becomes relatively high and a distance between the respective lower electrodes is reduced.

According to an aspect of the inventive concept, there is provided an IC device including a lower electrode including a main portion and a top portion, the main portion extending lengthwise in a vertical direction on a substrate and having a sidewall with at least one step portion, the top portion having a width less than that of the main portion in a lateral direction, and an upper support pattern in contact with the top portion of the lower electrode and extending parallel to the substrate. The upper support pattern includes a seam portion formed inside the upper support pattern at a position spaced apart from the top portion of the lower electrode in the lateral direction.

According to another aspect of the inventive concept, there is provided an IC device including a lower electrode extending lengthwise in a vertical direction from a first level to a second level on a substrate, the lower electrode including a first step portion and a top portion, wherein the first step portion is formed at a sidewall of the lower electrode at a third level between the first level and the second level, and the top portion has a top surface at the second level, and an upper support pattern extending parallel to the substrate at the second level and being in contact with the top portion of the lower electrode to support the lower electrode. The upper support pattern includes a seam portion formed inside the upper support pattern at a position spaced apart from the top portion of the lower electrode in a lateral direction.

According to another aspect of the inventive concept, there is provided an IC device including a plurality of lower electrodes spaced apart from each other on a substrate, an upper support pattern extending in a lateral direction parallel to the substrate, the upper support pattern having a plurality of holes through which the plurality of lower electrodes pass, and a lower support pattern extending in the lateral direction between the substrate and the upper support pattern and being in contact with each of the plurality of lower electrodes. The upper support pattern includes a seam portion formed inside the upper support pattern at a position spaced apart from the plurality of lower electrodes in the lateral direction.

According to another aspect of the inventive concept, there is provided a method of manufacturing an IC device. The method includes forming a mold pattern and an upper sacrificial support pattern on a substrate. A plurality of holes pass through the mold pattern and the upper sacrificial support pattern. A plurality of lower electrodes are formed inside the plurality of holes. The upper sacrificial support pattern is removed such that a top portion of each of the plurality of lower electrodes protrudes above a top surface of the mold pattern, thereby forming a peripheral space on the mold pattern. A width and a height of the top portion of each of the plurality of lower electrodes are reduced to form an enlarged peripheral space. An upper support pattern is formed to fill the enlarged peripheral space and to be in contact with the top portion of each of the plurality of lower electrodes. The mold pattern is removed to expose a sidewall of a first portion of each of the plurality of lower electrodes.

According to another aspect of the inventive concept, there is provided a method of manufacturing an IC device. The method includes forming a mold structure pattern including a mold pattern and an upper sacrificial support pattern on a substrate. A plurality of holes pass through the mold pattern and the upper sacrificial support pattern. A plurality of sacrificial spacers are formed inside the plurality of holes. The plurality of sacrificial spacers cover an upper sidewall of the mold structure pattern. A plurality of lower electrodes are formed to fill the plurality of holes and are in contact with the plurality of sacrificial spacers. A portion of each of the upper sacrificial support pattern and the plurality of sacrificial spacers is removed to form a peripheral space on the mold pattern. The peripheral space exposes a top portion of each of the plurality of lower electrodes. A width and a height of the top portion of each of the plurality of lower electrodes are reduced. An upper support pattern is formed on the mold pattern. The upper support pattern fills the peripheral space and is in contact with the top portion of each of the plurality of lower electrodes. The remaining portion of each of the mold pattern and the plurality of sacrificial spacers is removed to expose a sidewall of each of the plurality of lower electrodes below the top portion.

According to another aspect of the inventive concept, there is provided a method of manufacturing an IC device. The method includes forming a mold structure pattern including a lower mold pattern, a lower support pattern, an upper mold pattern, and an upper sacrificial support pattern on a substrate. A plurality of holes pass through the lower mold pattern, the lower support pattern, the upper mold pattern, and the upper sacrificial support pattern. A plurality of sacrificial spacers are formed inside the plurality of holes. The plurality of sacrificial spacers cover an upper sidewall of the mold structure pattern. A plurality of lower electrodes are formed to fill the plurality of holes and to be in contact with the plurality of sacrificial spacers. A portion of each of the upper sacrificial support pattern and the plurality of sacrificial spacers is removed to form a peripheral space on the mold structure pattern. The peripheral space exposes a top portion of each of the plurality of lower electrodes. A width and a height of the top portion of each of the plurality of lower electrodes are reduced. An upper support pattern is formed on the mold structure pattern. The upper support pattern fills the peripheral space and extends parallel to the substrate. The upper support pattern includes a seam portion at a position spaced apart from the plurality of lower electrodes in a lateral direction. The remaining portion of each of the upper mold pattern and the plurality of sacrificial spacers is removed to expose a first sidewall of each of the plurality of lower electrodes between the lower support pattern and the upper support pattern. A portion of each of the plurality of lower electrodes is removed from the first sidewall of each of the plurality of lower electrodes, thereby forming a step portion at the first sidewall of each of the plurality of lower electrodes. The lower mold pattern is removed.

BRIEF DESCRIPTION OF THE DRAWINGS

Embodiments of the inventive concept will be more clearly understood from the following detailed description taken in conjunction with the accompanying drawings in which:

FIGS. 1A to 11M are cross-sectional views illustrating a process sequence of a method of manufacturing an IC device, according to example embodiments;

DETAILED DESCRIPTION OF THE EMBODIMENTS

Figure 1:
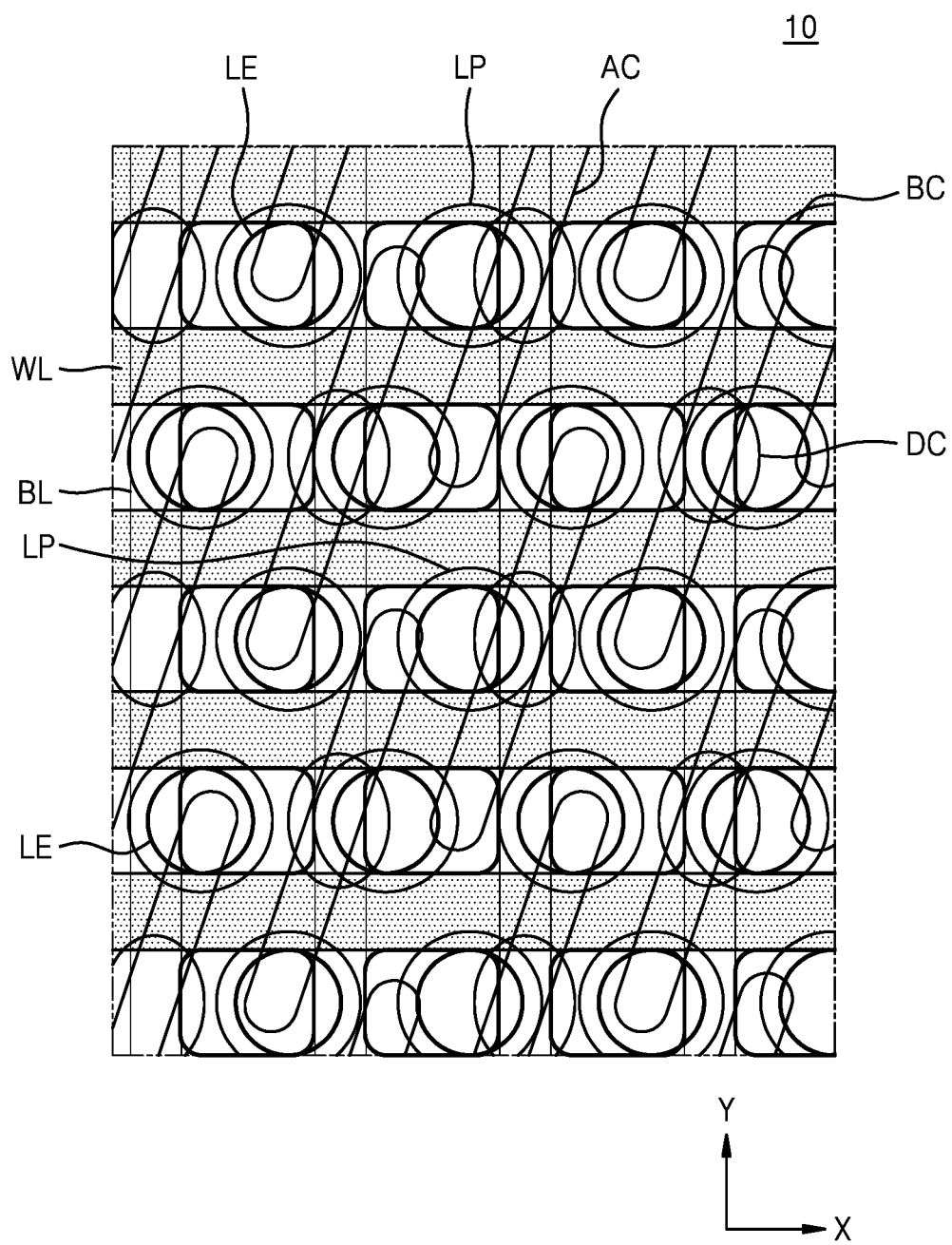
FIG. 1 is a schematic plan layout of some components of a memory cell array region of an integrated circuit (IC) device, according to example embodiments.

Hereinafter, embodiments will be described in detail with reference to the accompanying drawings. The same reference numerals are used to denote the same elements in the drawings, and repeated descriptions thereof will be omitted.

FIG. 1 is a schematic plan layout of some components of a memory cell array region of an IC device 10 according to example embodiments.

Referring to FIG. 1, the IC device 10 may include a plurality of active regions AC, which extend in a third lateral direction, which is an oblique direction to a first lateral direction (X direction) and a second lateral direction (Y direction) when viewed from above. A plurality of word lines WL may intersect with the plurality of active regions AC and extend lengthwise in parallel with each other in the X direction. A plurality of bit lines BL may extend lengthwise in parallel with each other in the Y direction on the plurality of word lines WL. Each of the plurality of bit lines BL may be connected to the active region AC through a direct contact DC.

A plurality of buried contacts BC may be formed between two adjacent ones of the plurality of bit lines BL. A plurality of conductive landing pads LP may be formed on the plurality of buried contacts BC. Each of the plurality of conductive landing pads LP may be arranged to at least partially overlap the buried contact BC. A plurality of lower electrodes LE may be formed on the plurality of conductive landing pads LP and spaced apart from each other. The plurality of lower electrodes LE may be connected to the plurality of active regions AC through the plurality of buried contacts BC and the plurality of conductive landing pad LP.

Figure 2A:
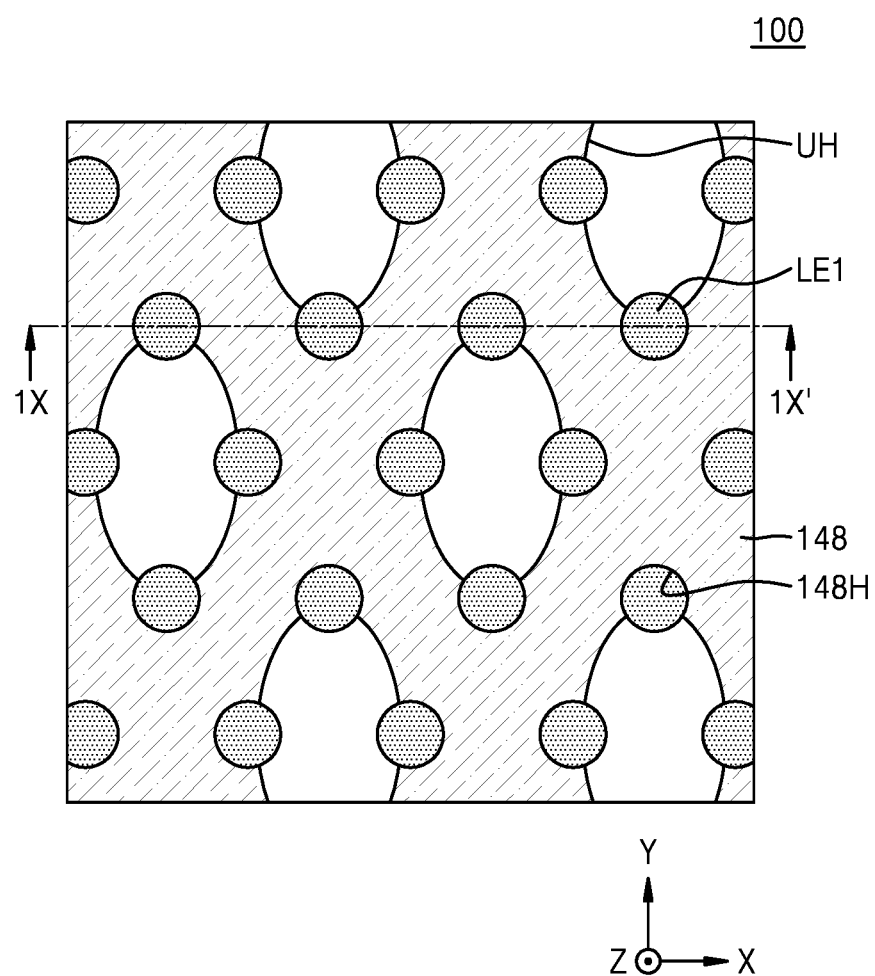
FIG. 2A is a plan view of some components of an IC device, according to example embodiments.
Figure 2B:
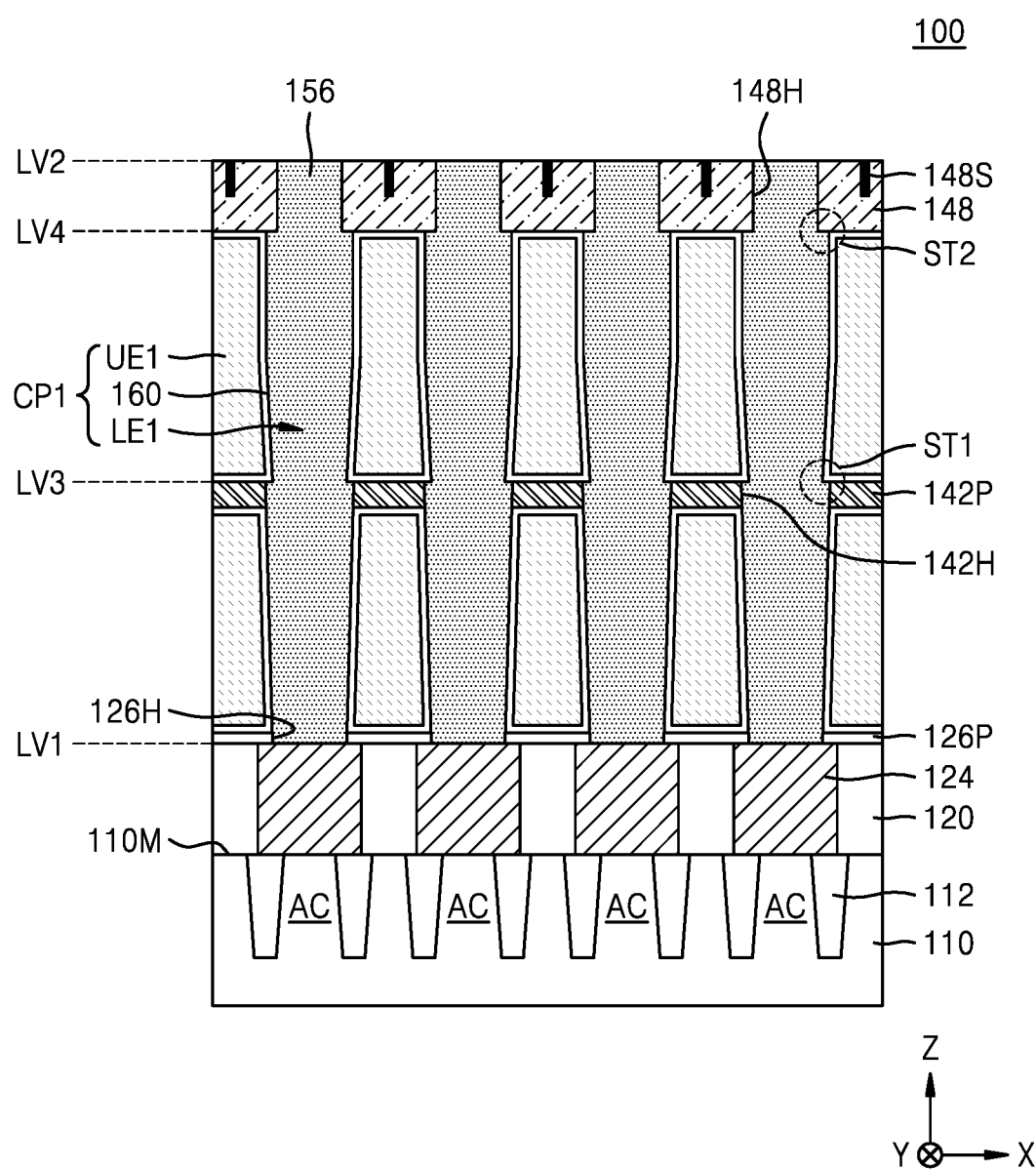
FIG. 2B is a schematic cross-sectional view of some components taken along a line 1X-1X' of FIG. 2A.
Figure 2C:
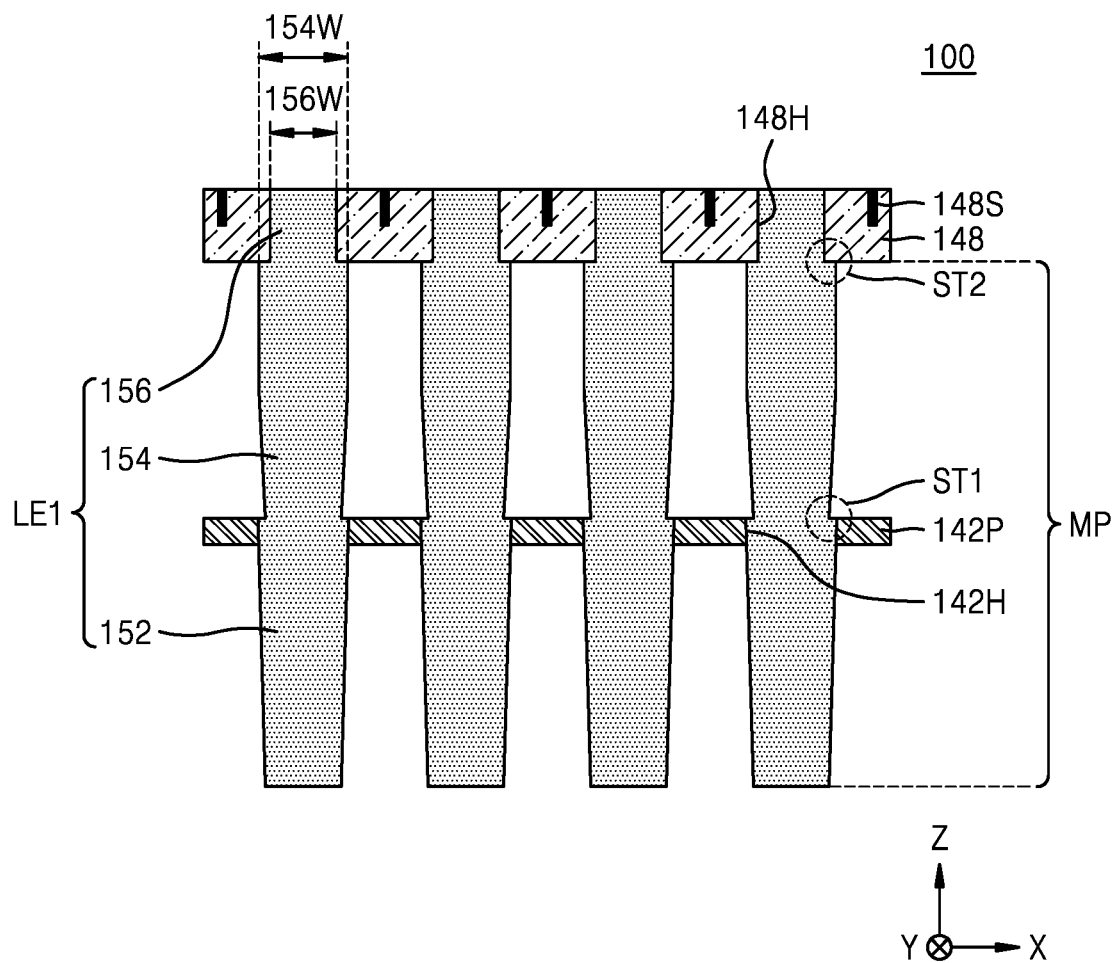
FIG. 2C is a cross-sectional view of only some of the components of the IC device shown in FIG. 2B.

FIG. 2A is a plan view of some components of an IC device 100 according to example embodiments. FIG. 2B is a schematic cross-sectional view of some components taken along a line 1X-1X' of FIG. 2A. FIG. 2C is a cross-sectional view of only some of the components of the IC device 100 shown in FIG. 2B.

Referring to FIGS. 2A to 2C, the IC device 100 may constitute a portion of the IC device 10 shown in FIG. 1. Some components of the IC device 100 are omitted or briefly illustrated in FIGS. 2A to 2C. However, a configuration of the IC device 100 is not limited to those illustrated in FIGS. 2A to 2C, and it will be understood that the IC device 100 includes characteristic configurations described below.

The IC device 100 may include a substrate 110 including a plurality of active regions AC and a lower structure 120 formed on the substrate 110. A plurality of conductive regions 124 may pass through the lower structure 120 and be connected to the plurality of active regions AC.

The substrate 110 may include a semiconductor element, such as silicon (Si) and germanium (Ge), or a compound semiconductor, such as silicon carbide (SiC), germanium arsenide (GaAs), indium arsenide (InAs), and indium phosphide (InP). The substrate 110 may include a semiconductor substrate, at least one insulating film formed on the semiconductor substrate, or structures including at least one conductive region. The conductive region may include, for example, a doped well or a doped structure. Device isolation regions 112 may be formed in the substrate 110 to define a plurality of active regions AC. The device isolation regions 112 may include an oxide film, a nitride film, or a combination thereof.

In example embodiments, the lower structure 120 may include an insulating film including a silicon oxide film, a silicon nitride film, or a combination thereof. In other example embodiments, the lower structure 120 may include various conductive regions (e.g., an interconnection layer, a contact plug, and a transistor) and an insulating film configured to insulate the conductive regions from each other. The plurality of conductive regions 124 may include polysilicon, a metal, a conductive metal nitride, a metal silicide, or a combination thereof. The lower structure 120 may include a plurality of bit lines BL described with reference to FIG. 1. Each of the plurality of conductive regions 124 may include the buried contact BC and the conductive landing pad LP, which are described with reference to FIG. 1.

An insulating pattern 126P having a plurality of openings 126H may be arranged on the lower structure 120 and the plurality of conductive regions 124. The insulating pattern 126P may include a silicon nitride film, a silicon carbon nitride film, a boron-containing silicon nitride film, or a combination thereof.

A plurality of capacitors CP1 including a plurality of lower electrodes LE1, a dielectric film 160, and an upper electrode UE1 may be located on the plurality of conductive regions 124. Each of the plurality of lower electrodes LE1 may have a pillar shape, which extends lengthwise away from the substrate 110 in a vertical direction (Z direction) from a top surface of the conductive region 124 through the opening 126H of the insulating pattern 126P. The plurality of lower electrodes LE1 may face the upper electrode UE1 with the dielectric film 160 therebetween. Although FIGS. 2B and 2C illustrate an example in which each of the plurality of lower electrodes LE1 has a pillar shape, the inventive concept is not limited thereto. For example, each of the plurality of lower electrodes LE1 may have a sectional structure with a cup shape or a cylindrical shape of which a bottom portion is blocked. An item, layer, or portion of an item or layer described as extending "lengthwise" in a particular direction has a length in the particular direction and a width perpendicular to that direction, where the length is greater than the width.

Each of the plurality of lower electrodes LE1 and the upper electrode UE1 may include a metal film, a conductive metal oxide film, a conductive metal nitride film, a conductive metal oxynitride film, or a combination thereof. In example embodiments, each of the plurality of lower electrodes LE1 and the upper electrode UE1 may include titanium (Ti), Ti oxide, Ti nitride, Ti oxyntiride, cobalt (Co), Co oxide, Co nitride, Co oxyntiride, niobium (Nb), Nb oxide, Nb nitride, Nb oxyntiride, tin (Sn), Sn oxide, Sn nitride, Sn oxyntiride, or a combination thereof. For example, each of the lower electrode LE1 and the upper electrode UE1 may include titanium nitride (TiN), cobalt nitride (CoN), niobium nitride (NbN), tin oxide ($SnO_2$), or a combination thereof. The dielectric film 160 may include hafnium oxide ($HfO_2$), zirconium oxide ($ZrO_2$) aluminum oxide ($Al_2O_3$), lanthanum oxide ($La_2O_3$), tantalum oxide ($Ta_2O_3$), niobium oxide ($Nb_2O_3$), cerium oxide ($Ce_2$), titanium oxide ($TiO_2$), germanium oxide ($Ge_2$), or a combination thereof.

The plurality of lower electrodes LE1 may extend lengthwise in a vertical direction from a first level LV1 to a second level LV2 on the substrate 110. As used herein, a term "level" refers to a distance from a main surface 110M of the substrate 110 in a vertical direction (Z direction or –Z direction). The plurality of lower electrodes LE1 may be supported by a lower support pattern 142P and an upper support pattern 148. Each of the plurality of lower electrodes LE1 may include a first portion 152, a second portion 154, and a top portion 156. The first portion 152 may extend lengthwise in a vertical direction (Z direction) between the conductive region 124 and the lower support pattern 142P. For example, the first portion 152 may extend from the upper surface of the conductive region 124 to a third level LV3. The second portion 154 may extend lengthwise in the vertical direction (Z direction) between the lower support pattern 142P and the upper support pattern 148. For example, the second portion 154 may extend from the third level LV3 to a fourth level LV4. The top portion 156 may have a sidewall in contact with the upper support pattern 148. The top portion 156 may have a top surface at the second level LV2. The first portion 152, the second portion 154, and the top portion 156 may be in material continuity with each other, and the first portion 152 and the second portion 154 may constitute a main portion MP of the lower electrode LE1. The top portion 156 may have a width less than that of the main portion MP in a lateral direction. As used herein, the term "material continuity" may refer to structures, patterns, and/or layers that are formed at the same time and of the same material, without a break in the continuity of the material of which they are formed. As one example, structures, patterns, and/or layers that are in "material continuity" may be homogeneous monolithic structures.

A first step portion ST1 may be formed at a sidewall of each of the plurality of lower electrodes LE1 at the third level LV3 between the first level LV1 and the second level LV2. The first step portion ST1 may be formed at a sidewall of the main portion MP of each of the plurality of lower electrodes LE1 between the first portion 152 and the second portion 154.

A second step portion ST2 may be formed at the sidewall of each of the plurality of lower electrodes LE1 at the fourth level LV4 between the second level LV2 and the third level LV3. The second step portion ST2 may be formed at the sidewall of each of the plurality of lower electrodes LE1 between the second portion 154 and the top portion 156. The top portion 156 may extend in a direction away from the substrate 110 from the fourth level LV4 to the second level LV2.

In each of the plurality of lower electrode LE1, a lateral width of the top portion 156 may be less than a lateral width of the first portion 152, which extends in the vertical direction between the first level LV1 and the third level LV3. A lateral width of each of the plurality of lower electrodes LE1 may be abruptly changed with respect to the first step portion ST1 and the second step portion ST2, which serve as boundaries between the first and second portions 152 and 154 and between the second and top portions 154 and 156, respectively. By using the first step portion ST1 as a boundary, a lateral width of the second portion 154 at a higher level than the first step portion ST1 may be less than a lateral width of the first portion 152 at a lower level than the first step portion ST1. In addition, by using the second step portion ST2 as a boundary, a lateral width of the top portion 156 at a higher level than the second step portion ST2 may be less than a lateral width of the second portion 154 at a lower level than the second step portion ST2. For example, a width 154W of the second portion 154 in the lateral direction may be less than a width 156W of the top portion 156 in the lateral direction near the second step portion ST2.

Each of the lower support pattern 142P and the upper support pattern 148 may extend parallel to the substrate 110 in the lateral direction. For example, upper and lower surfaces of the lower support pattern 142P and the upper support pattern 148 may be parallel to the main surface 110M of the substrate 110. A plurality of holes 142H through which the plurality of lower electrodes LE1 pass may be formed in the lower support pattern 142P, and a plurality of holes 148H through which the plurality of lower electrodes LE1 pass may be formed in the upper support pattern 148. Also, a plurality of upper holes UH may be formed in the upper support pattern 148. Although FIG. 2A illustrates a case in which each of the plurality of upper holes UH has a planar outline passing through four adjacent lower electrodes LE1, a planar shape of each of the plurality of upper holes UH is not limited to that shown in FIG. 2A and may be variously modified and changed within the scope of the inventive concept. A plurality of lower holes (not shown) having planar shapes corresponding to planar shapes of the plurality of upper holes UH may be formed in the lower support pattern 142P.

The lower support pattern 142P may be in contact with the first step portion ST1 of each of the plurality of lower electrodes LE1 and support the main portion MP of each of the plurality of lower electrodes LE1 between the first level LV1 and the third level LV3. The lower support pattern 142P may include a silicon nitride film, a silicon carbonitride film, a boron-containing silicon nitride film, or a combination thereof, but is not limited thereto.

The upper support pattern 148 may in contact with a sidewall of the top portion 156 of each of the plurality of lower electrodes LE1 and the second step portion ST2. A top surface of the upper support pattern 148 and a top surface of the top portion 156 may extend on the same plane at the second level LV2. For example, top surfaces of the upper support pattern 148 and the top portion 156 may be coplanar with each other. The upper support pattern 148 may include a seam portion 148S formed therein. The seam portion 148S may be formed to be spaced apart from the top portion 156 of each of the plurality of lower electrodes LE1 in a lateral direction in the upper support pattern 148 and formed to be spaced apart from a bottom surface of the upper support pattern 148 in a vertical direction. The seam portion 148S may continuously or intermittently extend in an approximately vertical direction at an approximately central portion of a space between the respective top portions 156 of two adjacent lower electrodes LE1. A bottom portion of the seam portion 148S may be below the second level LV2 and above the fourth level LV4. When viewed in cross-section, the seam may be substantially perpendicular to the main surface 110M of the substrate 110. The upper support pattern 148 may include a silicon nitride film, a silicon oxycarbide (SiOC) film, a silicon carbonitride (SiCN) film, a silicon boron nitride (SiBN) film, a silicon boron carbonitride (SiBCN) film, or a combination thereof, but is not limited thereto.

Figure 2D:
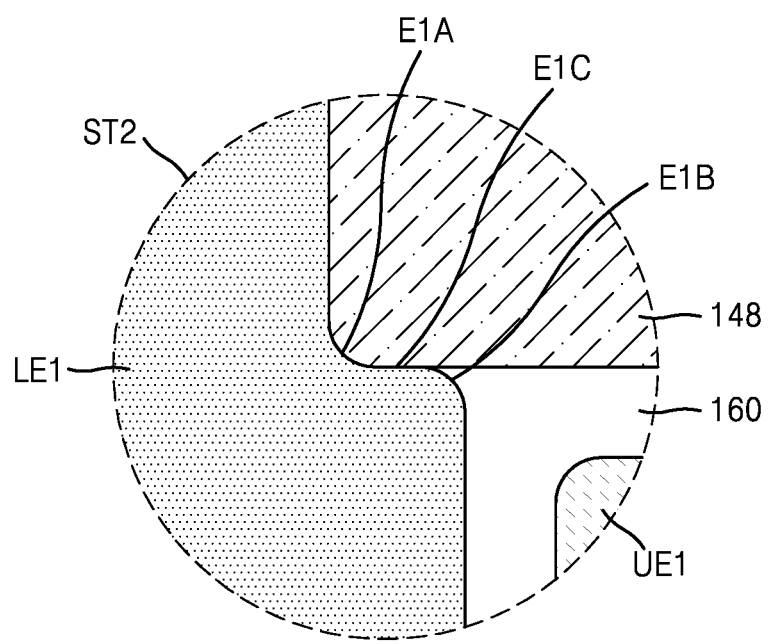
FIGS. 2D and 2E are enlarged cross-sectional views of modified examples of a partial region of the IC device shown in FIG. 2A.
Figure 2E:
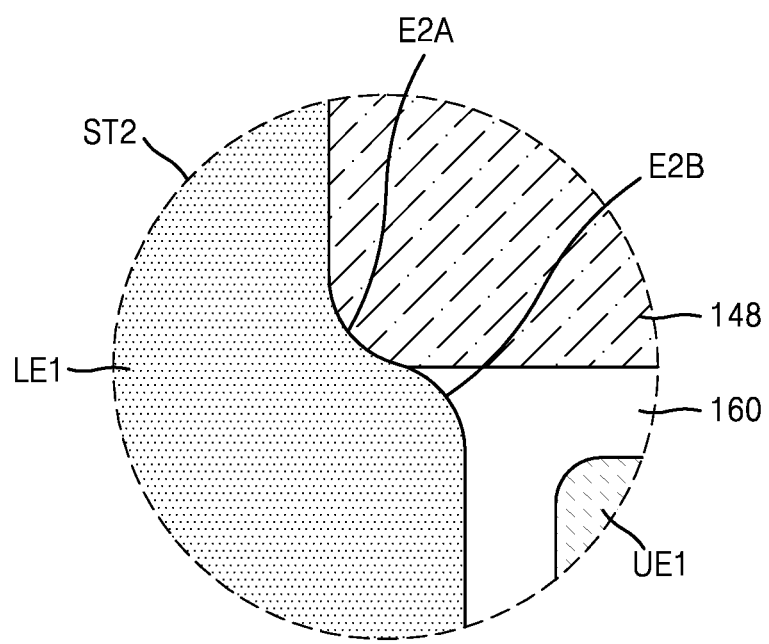

FIGS. 2D and 2E are enlarged cross-sectional views of modified examples of a partial region including the second step portion ST2 in the IC device 100 shown in FIGS. 2B to 2C.

In example embodiments, as shown in FIG. 2D, the second step portion ST2 of each of a plurality of lower electrodes LE1 may include a concave surface portion E1A in contact with an upper support pattern 148, a convex surface portion E1B in contact with a dielectric film 160, and a flat portion E1C extending parallel to a main surface 110M of a substrate 110 between the concave surface portion E1A and the convex surface portion E1B.

In other example embodiments, as shown in FIG. 2E, the second step portion ST2 of each of the plurality of lower electrodes LE1 may include a concave surface portion E2A in contact with an upper support pattern 148 and a convex surface portion E2B in contact with a dielectric film 160. The concave surface portion E2A may be connected to the convex surface portion E2B slantwise without a flat portion extending parallel to the main surface 110M of the substrate 110. In the IC device 100 described with reference to FIGS. 2A to 2C, a relatively large insulation distance may be ensured between top end portions of the respective lower electrodes LE. Accordingly, even if a height of the plurality of lower electrodes LE1 is increased and an aspect ratio of the plurality of lower electrodes LE is comparatively increased failures caused by an undesired bridge phenomenon between adjacent lower electrodes LE1 may be prevented, and the mass production efficiency of the IC device 100 may be improved.

Figure 3:
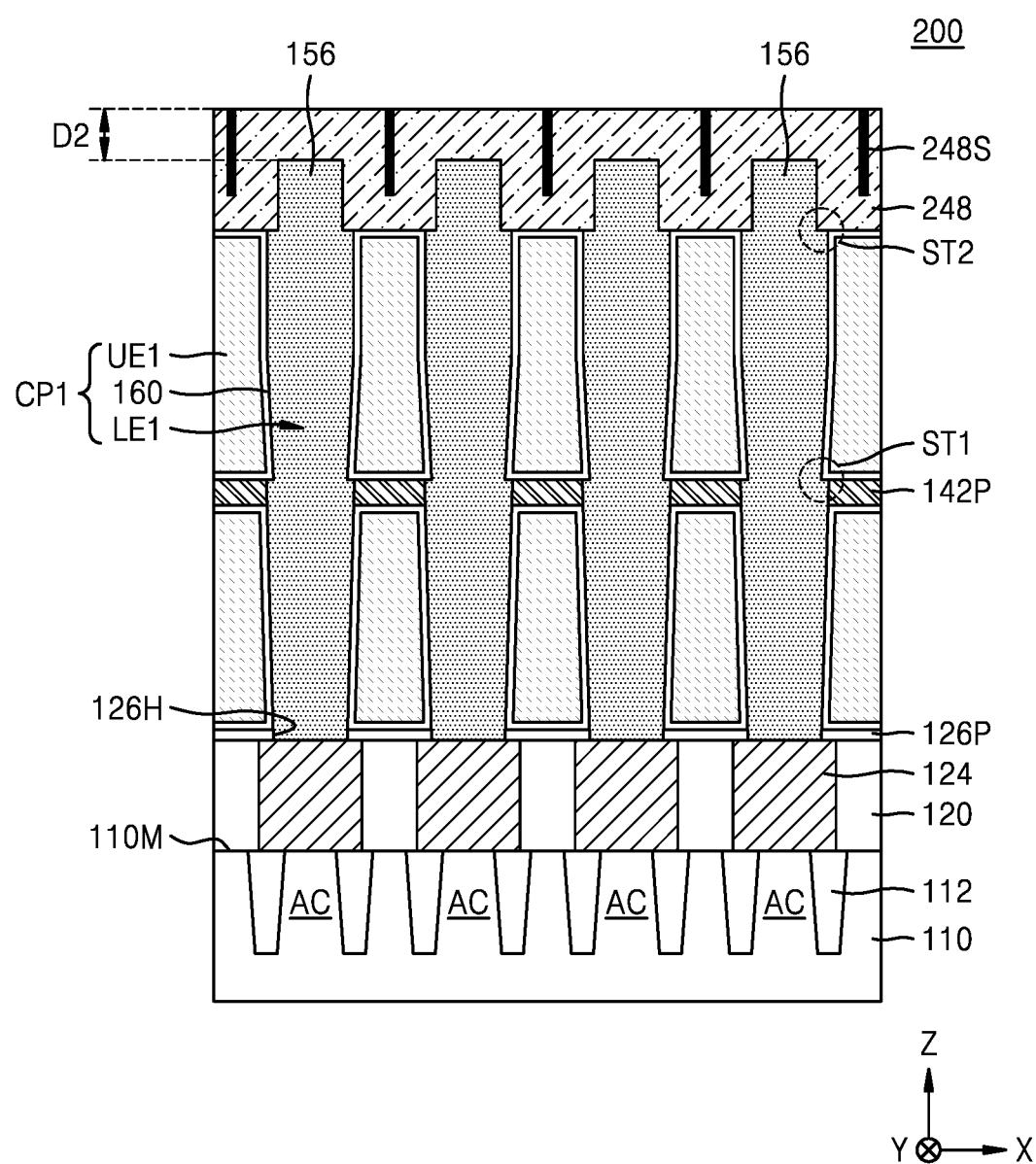
FIG. 3 is a schematic cross-sectional view of some components of an IC device, according to example embodiments.

FIG. 3 is a schematic cross-sectional view of some components of an IC device 200 according to example embodiments. The IC device 200 may constitute a portion of the IC device 10 shown in FIG. 1.

Referring to FIG. 3, the IC device 200 may have substantially the same configuration as the IC device 100 described with reference to FIGS. 2A to 2C. However, the IC device 200 may include an upper support pattern 248 in contact with a sidewall and a top surface of a top portion 156 of each of a plurality of lower electrodes LE1. A vertical distance from a main surface 110M of a substrate 110 to a top surface of the upper support pattern 248 may be greater than a vertical distance from the main surface 110M of the substrate 110 to the top surface of the top portion 156. The upper support pattern 248 covering the top surface of the top portion 156 of each of the plurality of lower electrodes LE1 may have a thickness D2 of about 1 nm to about 30 nm, but the inventive concept is not limited thereto. A seam portion 248S may be formed in the upper support pattern 248. Detailed configurations of the upper support pattern 248 and the seam portion 248S may be substantially the same as those of the upper support pattern 148 and the seam portion 148S, respectively, which are described with reference to FIGS. 2A to 2C. As used herein, thickness and height may refer to the thickness or the height measured in a direction perpendicular to the main surface 110M of the substrate 110.

Figure 4A:
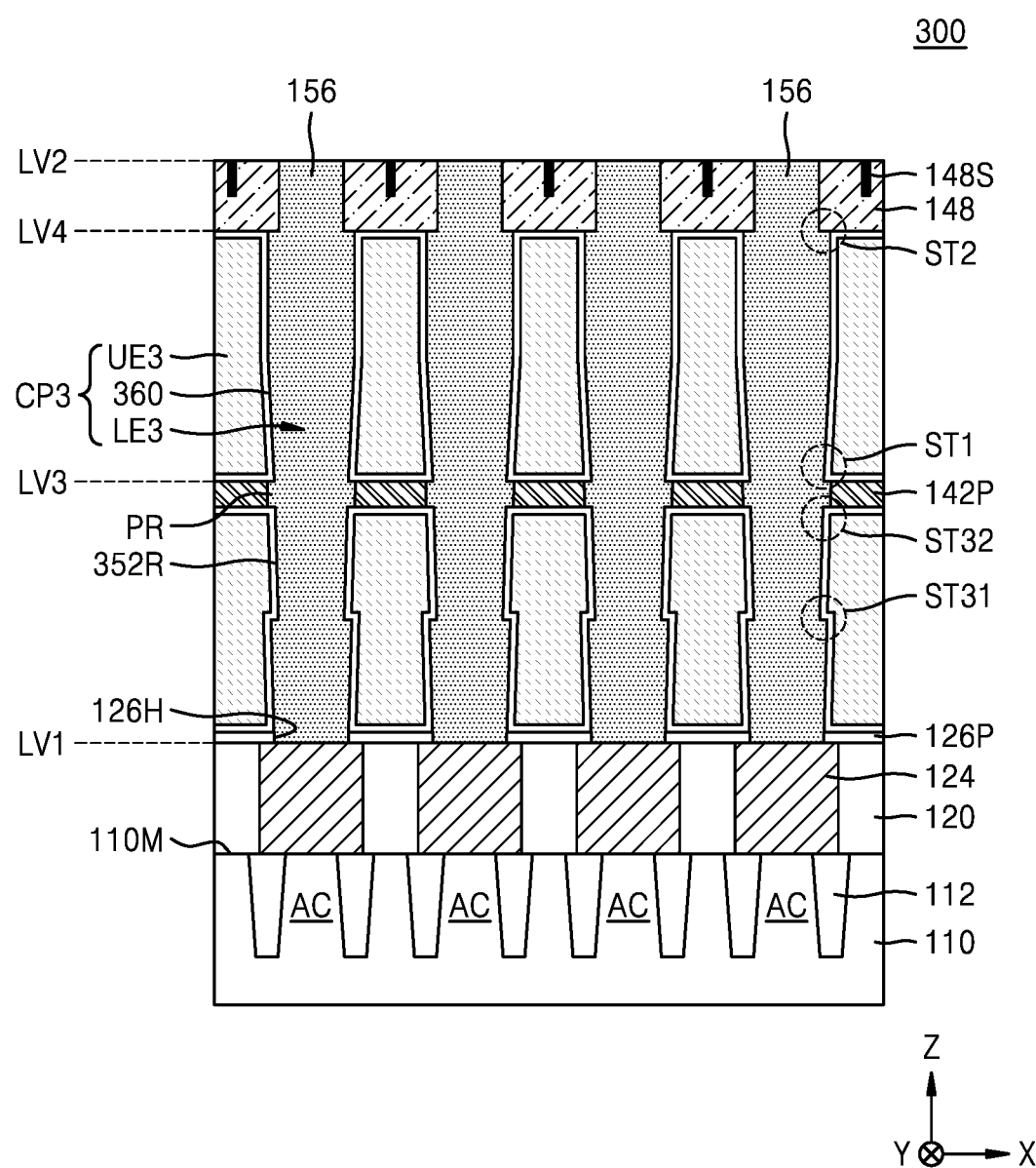
FIG. 4A is a cross-sectional view of some components of an IC device, according to example embodiments.
Figure 4B:
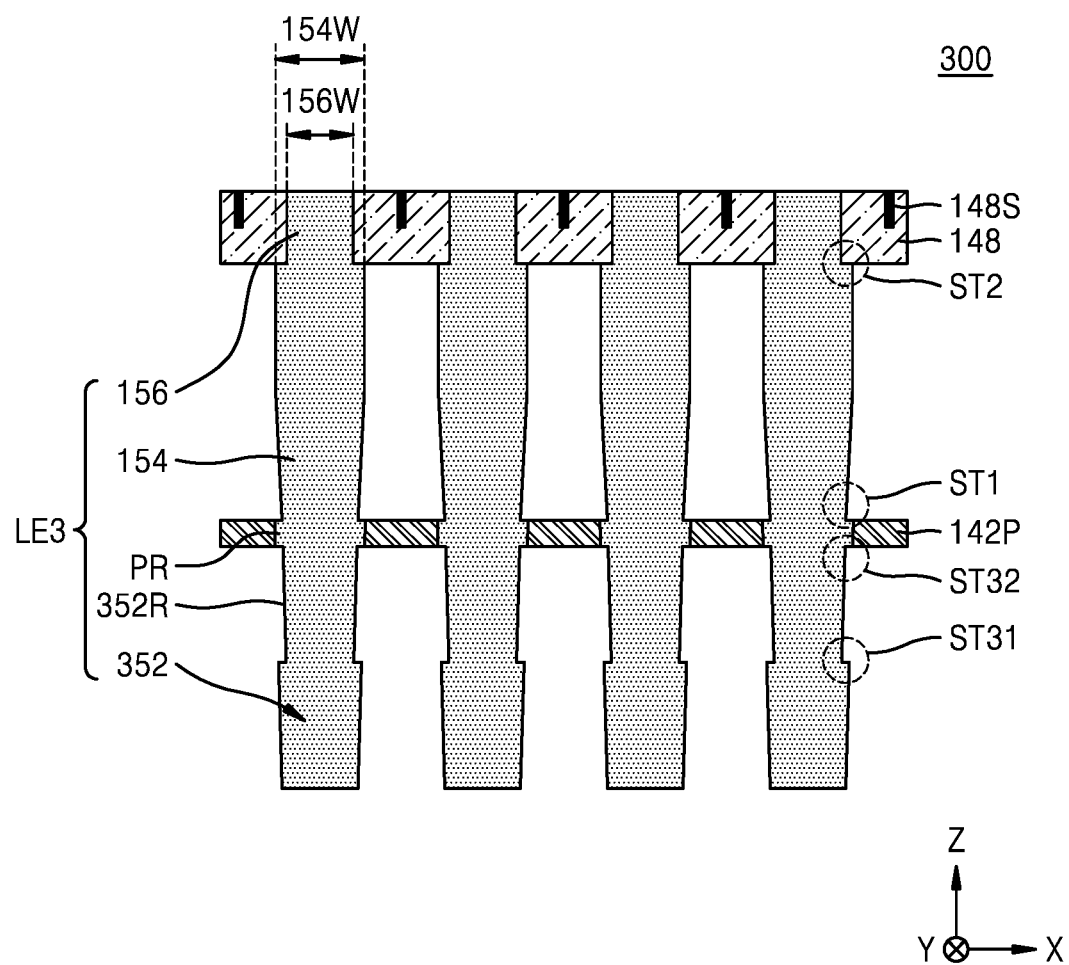
FIG. 4B is a cross-sectional view of only some of the components of the IC device shown in FIG. 4A.

FIG. 4A is a schematic cross-sectional view of some components of an IC device 300 according to example embodiments. FIG. 4B is a cross-sectional view of only some of the components of the IC device 300 shown in FIG. 4A. The IC device 300 may constitute a portion of the IC device 10 shown in FIG. 1.

Referring to FIGS. 4A and 4B, the IC device 300 may have substantially the same configuration as the IC device 100 described with reference to FIGS. 2A to 2C. However, in the IC device 300, a plurality of capacitors CP3 including a plurality of lower electrodes LE3, a dielectric film 360, and an upper electrode UE3 may be located on a plurality of conductive regions 124. Each of the plurality of lower electrodes LE3 may include a first portion 352, a second portion 154, and a top portion 156. The first portion 352 may have substantially the same configuration as the first portion 152 described with reference to FIGS. 2A to 2C. However, a recessed surface 352R may be formed at a sidewall of the first portion 352 between a first level LV1 and a third level LV3. Also, a plurality of third step portions (e.g., ST31 and ST32) defining a vertical height of the recessed surface 352R may be formed at the sidewall of the first portion 352.

A protrusion PR may be formed at a sidewall of each of the plurality of lower electrodes LE3 and protrude toward a lower support pattern 142P. The protrusion PR may be formed between a first step portion ST1 and the third step portion ST32 and be in contact with the lower support pattern 142P. In some embodiments, upper and lower surfaces of the protrusion PR may be coplanar with respective upper and lower surfaces of the adjacent lower support pattern 142P. As used herein, terms such as "same," "equal," "planar," or "coplanar" encompass near identicality including variations that may occur, for example, due to manufacturing processes.

Detailed configurations of the lower electrode LE3, the dielectric film 360, and the upper electrode UE3 may be the same as those of the lower electrode LE1, the dielectric film 160, and the upper electrode UE1, respectively, which are described with reference to FIGS. 2A to 2C.

Figure 5:
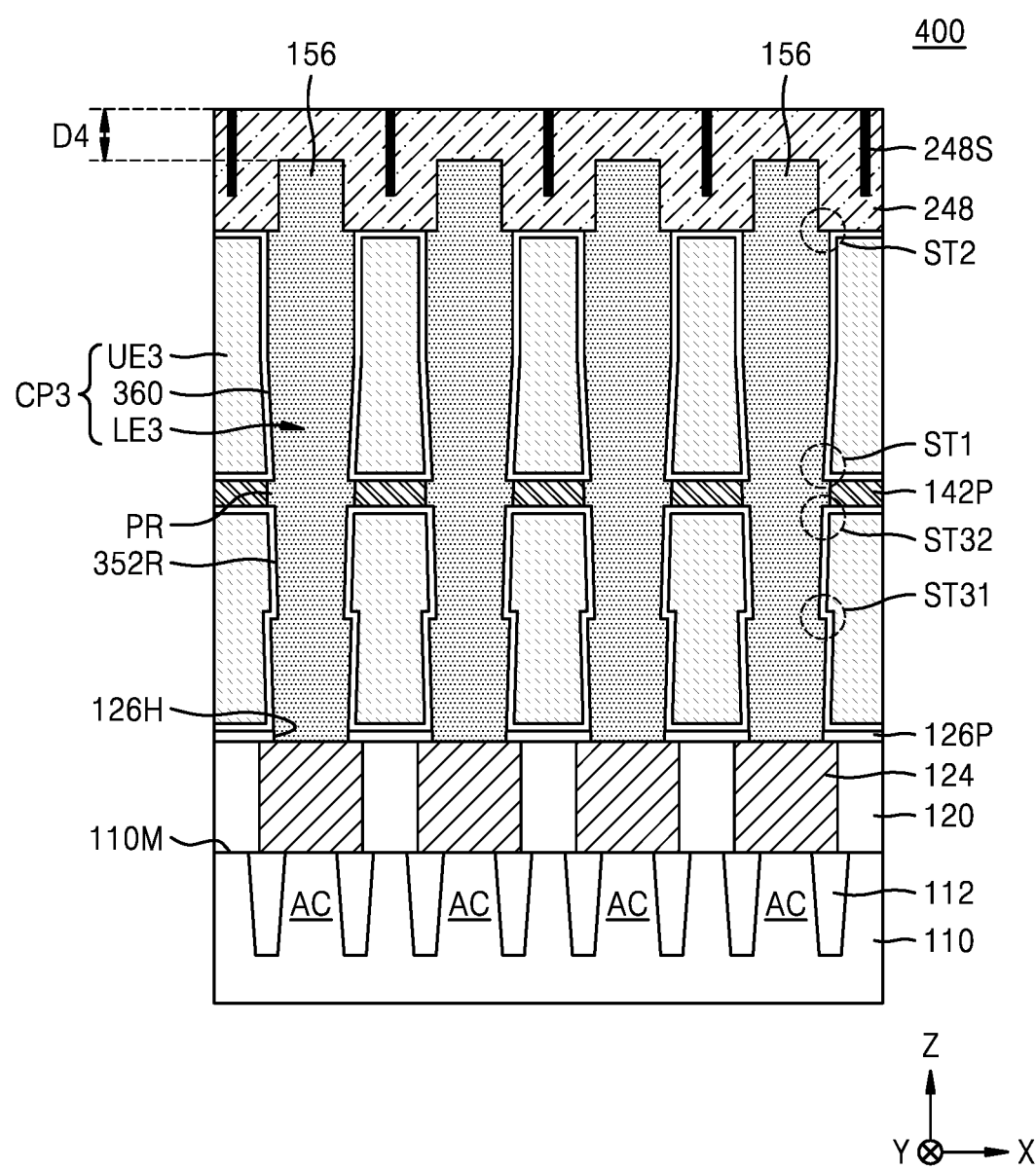
FIG. 5 is a schematic cross-sectional view of some components of an IC device, according to example embodiments.

FIG. 5 is a schematic cross-sectional view of some components of an IC device 400 according to example embodiments. The IC device 400 may constitute a portion of the IC device 10 shown in FIG. 1.

Referring to FIG. 5, the IC device 400 may have substantially the same configuration as the IC device 300 described with reference to FIGS. 4A and 4B. However, the IC device 400 may include an upper support pattern 248 in contact with a sidewall and a top surface of a top portion 156 of each of a plurality of lower electrodes LE3. The upper support pattern 248 covering the top surface of the top portion 156 of each of the plurality of lower electrodes LE3 may have a thickness D4 of about 1 nm to about 30 nm, but the inventive concept is not limited thereto. A seam portion 248S may be formed in the upper support pattern 248.

Figure 6A:
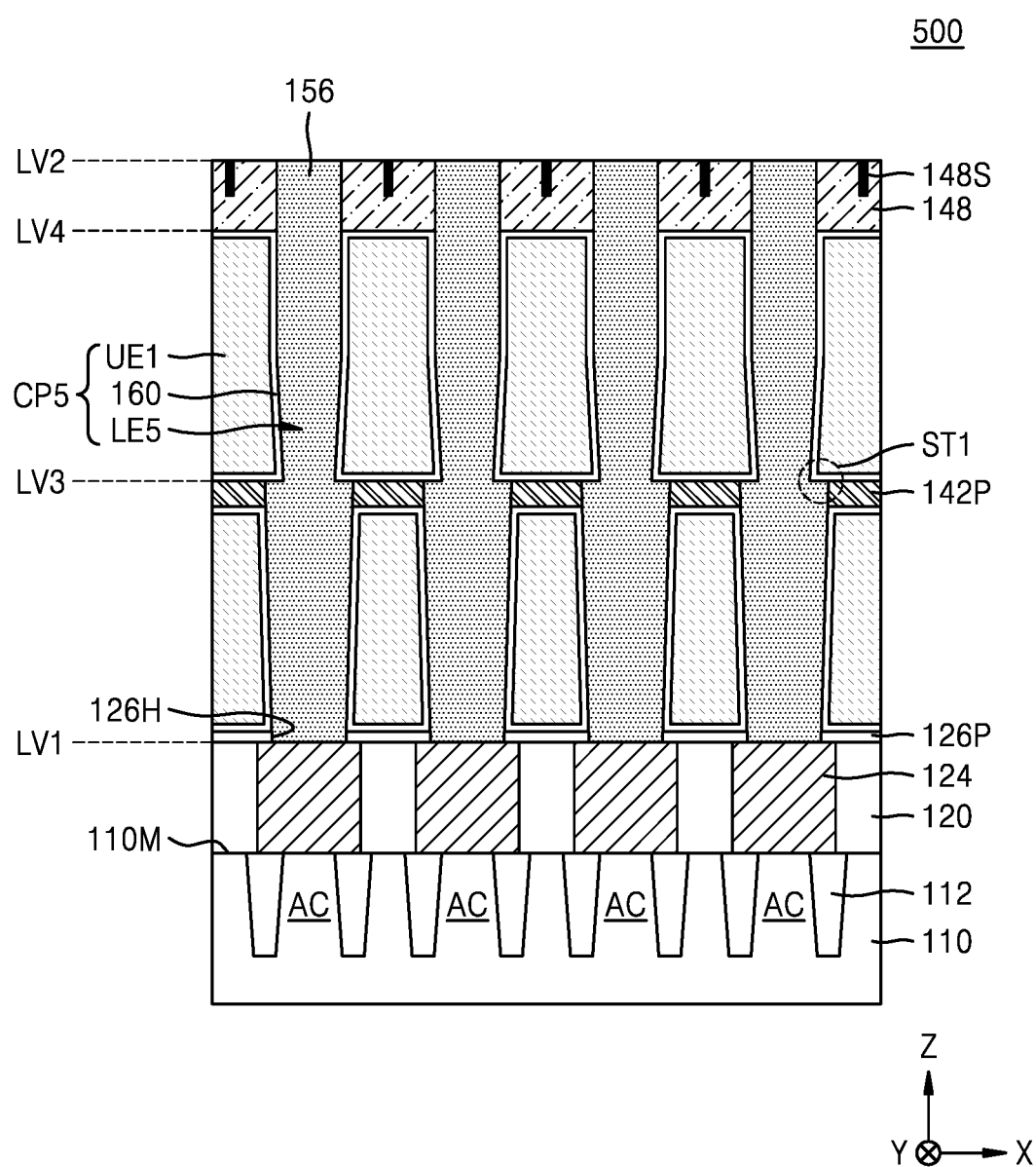
FIG. 6A is a schematic cross-sectional view of some components of an IC device, according to example embodiments.
Figure 6B:
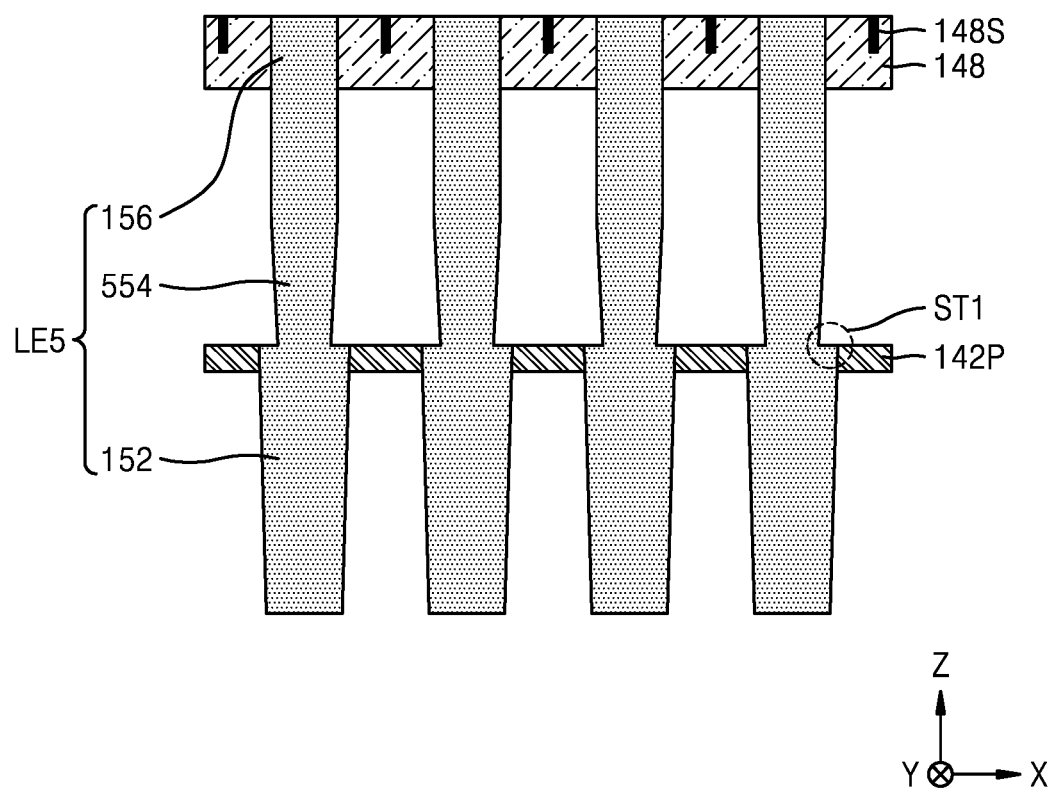
FIG. 6B is a cross-sectional view of only some of the components of the IC device shown in FIG. 6A.

FIG. 6A is a schematic cross-sectional view of some components of an IC device 500 according to example embodiments. FIG. 6B is a cross-sectional view of only some of the components of the IC device 500 shown in FIG. 6A. The IC device 500 may constitute a portion of the IC device 10 shown in FIG. 1.

Referring to FIGS. 6A and 6B, the IC device 500 may have substantially the same configuration as the IC device 100 described with reference to FIGS. 2A to 2C. However, in the IC device 500, a plurality of capacitors CP5 including a plurality of lower electrodes LE5, a dielectric film 160, and an upper electrode UE1 may be located on a plurality of conductive regions 124. Each of the plurality of lower electrodes LE5 may include a first portion 152, a second portion 554, and a top portion 156. The second portion 554 may have substantially the same configuration as the second portion 154 described with reference to FIGS. 2A to 2C. However, a sidewall of each of the plurality of lower electrodes LE5 may not include a step portion at a fourth level LV4 that corresponds to a boundary between the second portion 554 and the top portion 156 in each of the plurality of lower electrodes LE5 and the top portion 156. A detailed configuration of the lower electrode LE5 may be the same as that of the lower electrode LE1, which is described with reference to FIGS. 2A to 2C.

Figure 7A:
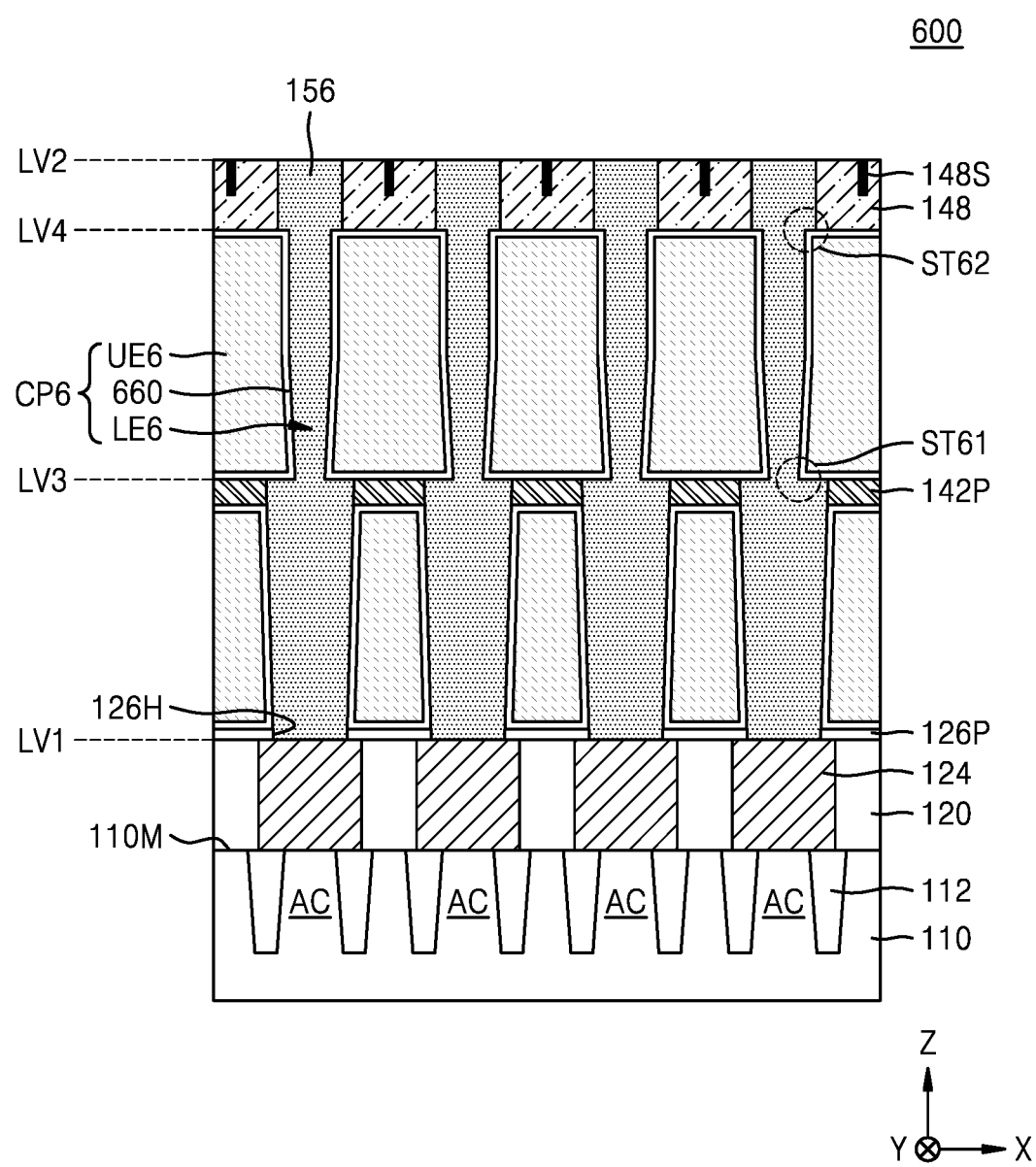
FIG. 7A is a schematic cross-sectional view of some components of an IC device, according to example embodiments.
Figure 7B:
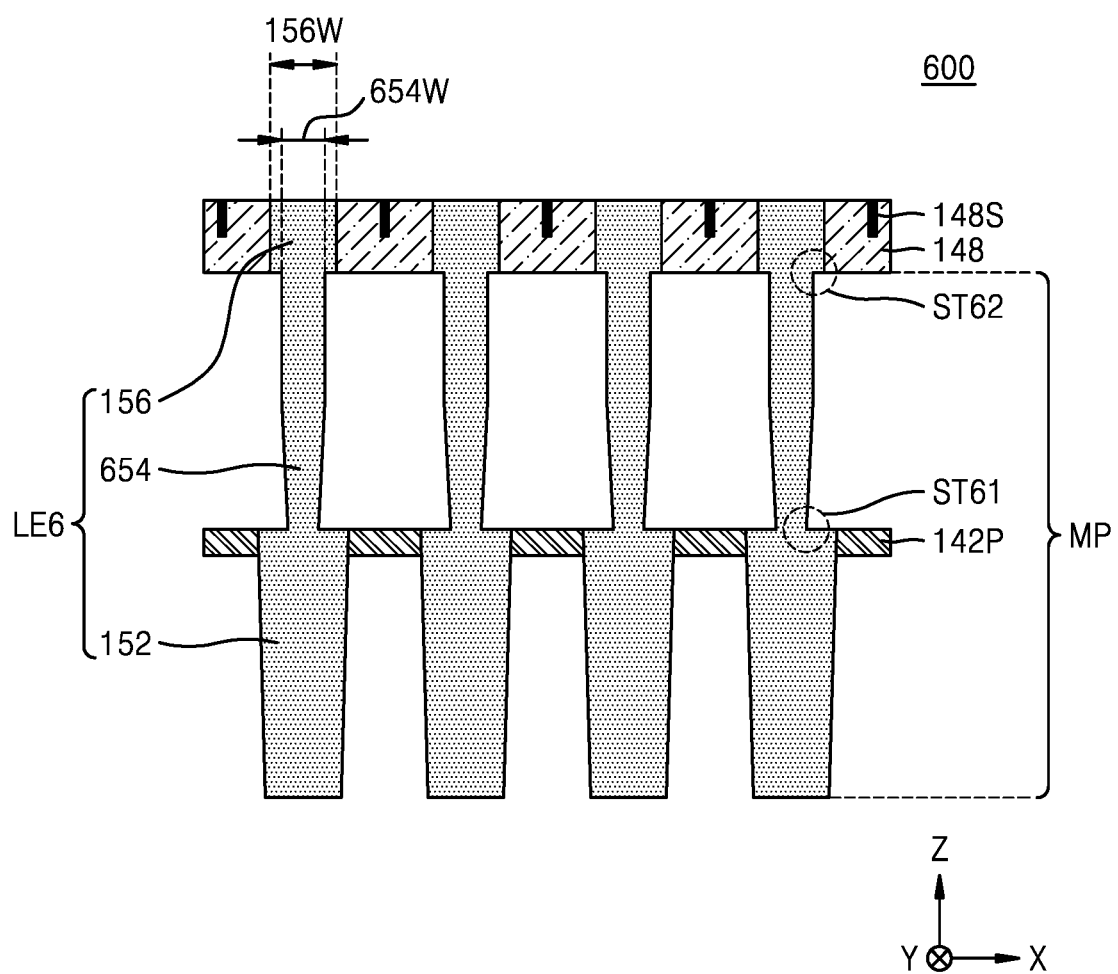
FIG. 7B is a cross-sectional view of only some of the components of the IC device shown in FIG. 7A.

FIG. 7A is a schematic cross-sectional view of some components of an IC device 600 according to example embodiments. FIG. 7B is a cross-sectional view of only some of the components of the IC device 600 shown in FIG. 7A. The IC device 600 may constitute a portion of the IC device 10 shown in FIG. 1.

Referring to FIGS. 7A and 7B, the IC device 600 may have substantially the same configuration as the IC device 100 described with reference to FIGS. 2A to 2C. However, in the IC device 600, a plurality of capacitors CP6 including a plurality of lower electrodes LE6, a dielectric film 660, and an upper electrode UE6 may be located on a plurality of conductive regions 124. Each of the plurality of lower electrodes LE6 may include a first portion 152, a second portion 654, and a top portion 156. The second portion 654 may have substantially the same configuration as the second portion 154 described with reference to FIGS. 2A to 2C. However, a lateral width 654W of the second portion 654 may be less than a lateral width 156W of the top portion 156 in a lateral direction. The second portion 654 of each of the plurality of lower electrodes LE6 may extend lengthwise in a vertical direction between a third level LV3 and a fourth level LV4.

A first step portion ST61 may be formed at a sidewall of each of the plurality of lower electrodes LE6 at the third level LV3. The first step portion ST61 may be formed at a sidewall of a main portion MP of each of the plurality of lower electrodes LE6 between the first portion 152 and the second portion 654. A second step portion ST62 may be formed at the sidewall of each of the plurality of lower electrodes LE6 at the fourth level LV4. The second step portion ST62 may be formed at the sidewall of each of the plurality of lower electrodes LE6 between the second portion 654 and the top portion 156. By using the second step portion ST62 as a boundary, a lateral width of the top portion 156 at a higher level than the second step portion ST62 may be greater than a lateral width of the second portion 654 at a lower level than the second step portion ST62. For example, a lateral width 156W of the top portion 156 may be greater than the lateral width 654W of the second portion 654 near the second step portion ST62.

Detailed configurations of the lower electrode LE6, the dielectric film 660, and the upper electrode UE6 may be the same as those of the lower electrode LE1, the dielectric film 160, and the upper electrode UE1, respectively, which are described with reference to FIGS. 2A to 2C.

Figure 8:
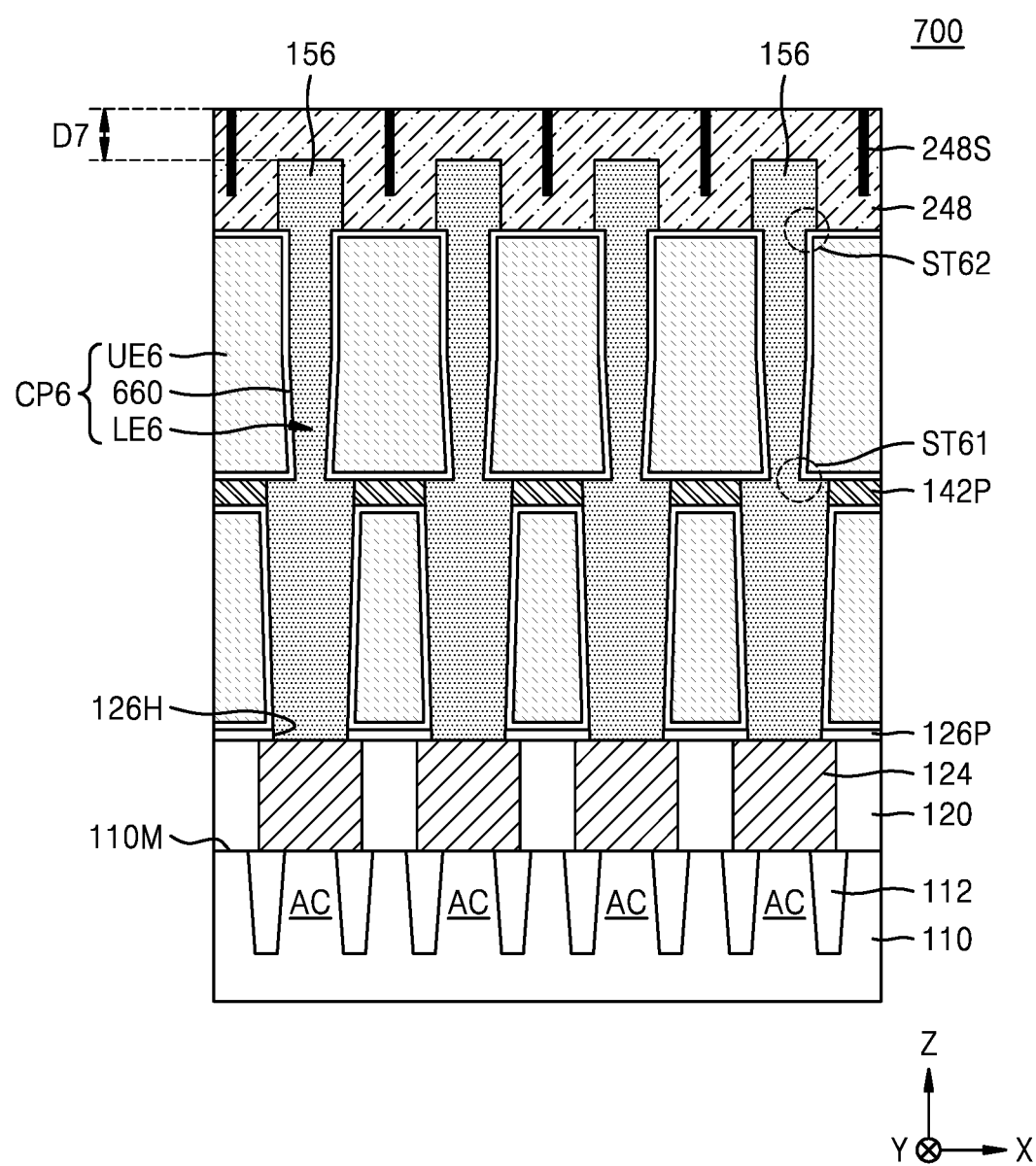
FIG. 8 is a schematic cross-sectional view of some components of an IC device, according to example embodiments.

FIG. 8 is a schematic cross-sectional view of some components of an IC device 700 according to example embodiments. The IC device 700 may constitute a portion of the IC device 10 shown in FIG. 1.

Referring to FIG. 8, the IC device 700 may have substantially the same configuration as the IC device 600 described with reference to FIGS. 7A and 7B. However, the IC device 700 may include an upper support pattern 248 in contact with a sidewall and a top surface of a top portion 156 of each of a plurality of lower electrodes LE6. The upper support pattern 248 covering the top surface of the top portion 156 of each of the plurality of lower electrodes LE6 may have a thickness D7 of about 1 nm to about 30 nm, but the inventive concept is not limited thereto. A seam portion 248S may be formed in the upper support pattern 248.

Figure 9A:
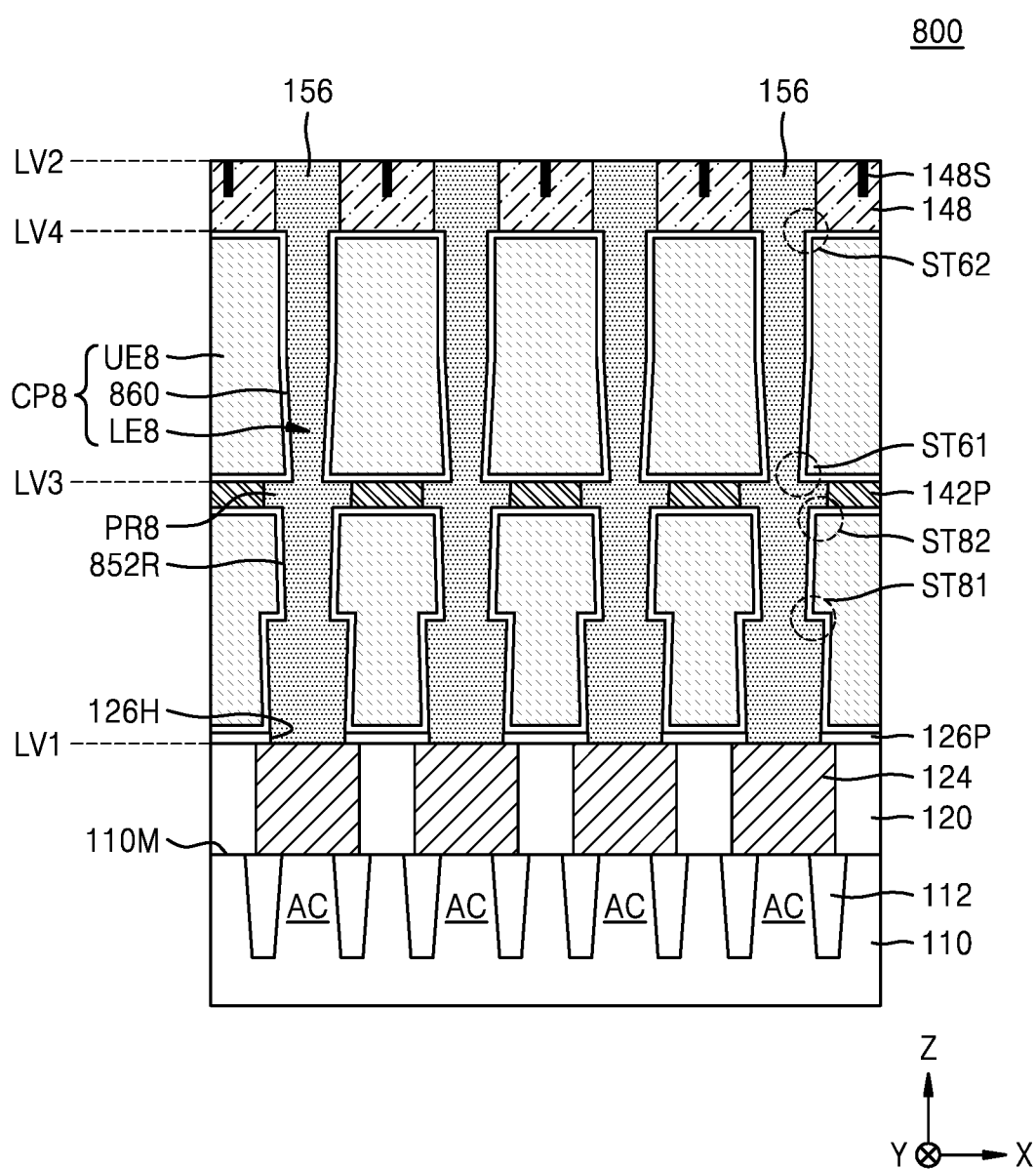
FIG. 9A is a schematic cross-sectional view of some components of an IC device, according to example embodiments.
Figure 9B:
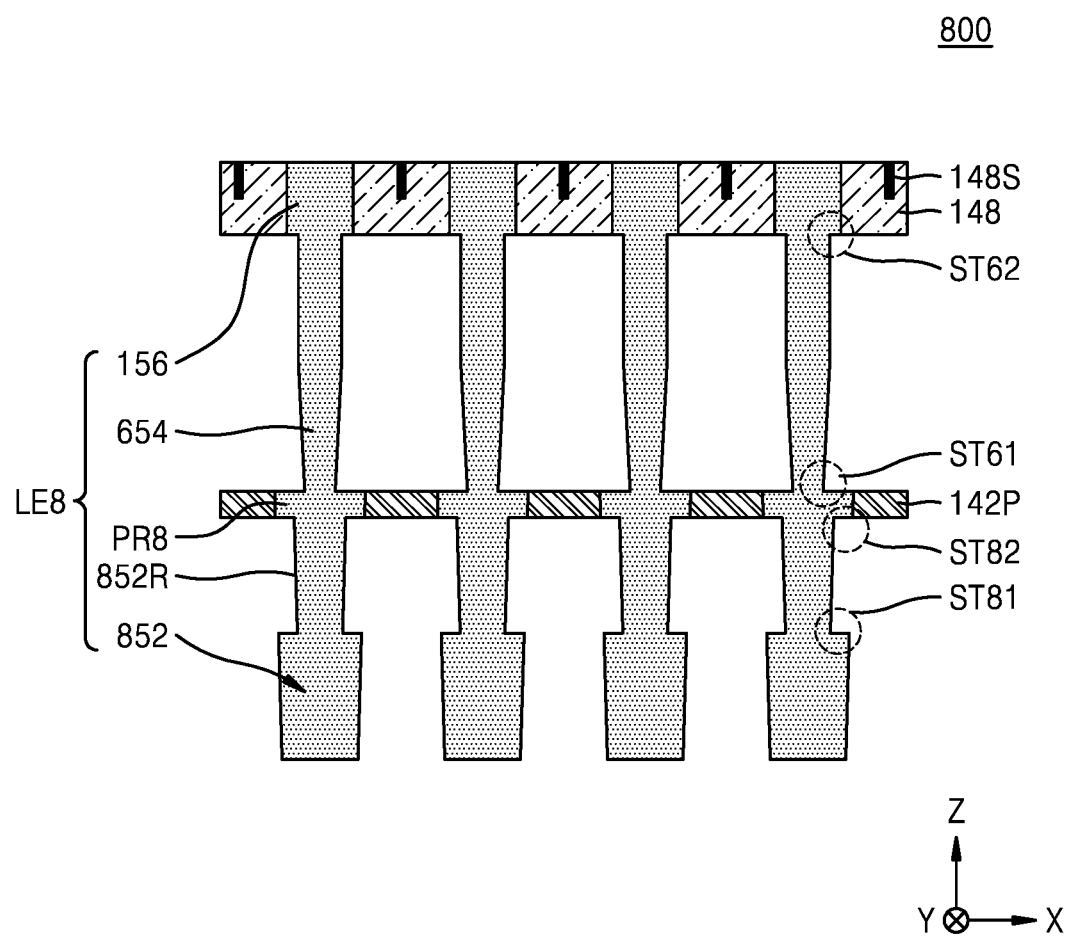
FIG. 9B is a cross-sectional view of only some of the components of the IC device shown in FIG. 9A.

FIG. 9A is a schematic cross-sectional view of some components of an IC device 800 according to example embodiments. FIG. 9B is a cross-sectional view of only some of the components of the IC device 800 shown in FIG. 9A. The IC device 800 may constitute a portion of the IC device 10 shown in FIG. 1.

Referring to FIGS. 9A and 9B, the IC device 800 may have substantially the same configuration as the IC device 600 described with reference to FIGS. 7A and 7B. However, in the IC device 800, a plurality of capacitors CP8 including a plurality of lower electrodes LE8, a dielectric film 860, and an upper electrode UE8 may be located on a plurality of conductive regions 124. Each of the plurality of lower electrodes LE8 may include a first portion 852, a second portion 654, and a top portion 156. The first portion 852 may have substantially the same configuration as the first portion 152 described with reference to FIGS. 2A to 2C. However, a recessed surface 852R may be formed at a sidewall of the first portion 852 between a first level LV1 and a third level LV3. Also, a plurality of third step portions (e.g., ST81 and ST82) defining a vertical height of the recessed surface 852R may be formed at the sidewall of the first portion 852.

A protrusion PR8 may be formed at a sidewall of each of the plurality of lower electrodes LE8 and protrude toward a lower support pattern 142P. The protrusion PR8 may be formed between a first step portion ST61 and the third step portion ST82 and be in contact with the lower support pattern 142P.

Detailed configurations of the lower electrode LE8, the dielectric film 860, and the upper electrode UE8 may be the same as those of the lower electrode LE1, the dielectric film 160, and the upper electrode UE1, respectively, which are described with reference to FIGS. 2A to 2C.

Figure 10:
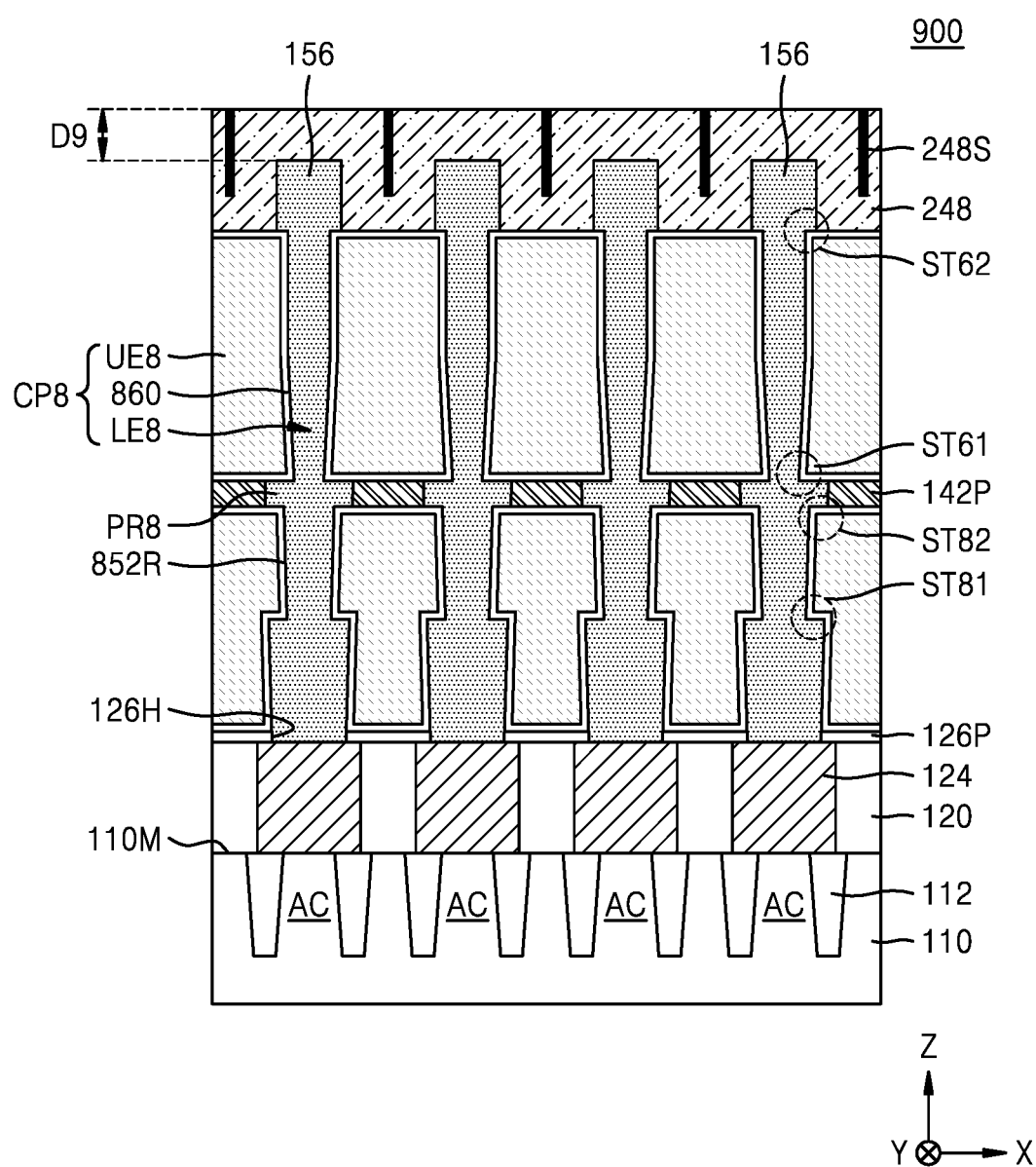
FIG. 10 is a schematic cross-sectional view of some components of an IC device, according to example embodiments.

FIG. 10 is a schematic cross-sectional view of some components of an IC device 900 according to example embodiments. The IC device 900 may constitute a portion of the IC device 10 shown in FIG. 1.

Referring to FIG. 10, the IC device 900 may have substantially the same configuration as the IC device 800 described with reference to FIGS. 9A and 9B. However, the IC device 900 may include an upper support pattern 248 in contact with a sidewall and a top surface of a top portion 156 of each of a plurality of lower electrodes LE8. The upper support pattern 248 covering the top surface of the top portion 156 of each of the plurality of lower electrodes LE8 may have a thickness D9 of about 1 nm to about 30 nm, but the inventive concept is not limited thereto. A seam portion 248S may be formed in the upper support pattern 248.

In the IC devices 100, 200, 300, 400, 500, 600, 700, 800, 900 according to the embodiments described with reference to FIGS. 2A to 10, a relatively large insulation distance may be ensured between respective top end portions of the plurality of lower electrodes LE1, LE3, LE5, LE6, and LE8. Accordingly, even if heights of the plurality of lower electrodes LE1, LE3, LE5, LE6, and LE8 are increased and aspect ratios of the plurality of lower electrodes LE1, LE3, LE5, LE6, and LE8 are comparatively increased, failures caused by an undesired bridge phenomenon between adjacent ones of the plurality of lower electrodes LE1, LE3, LE5, LE6, and LE8 may be prevented, and the mass production efficiency and reliability of the IC devices 100, 200, 300, 400, 500, 600, 70, 800, and 900 may be improved.

FIGS. 11A to 11M are cross-sectional views illustrating a process sequence of a method of manufacturing an IC device according to example embodiments. A method of manufacturing the IC device 100 shown in FIGS. 2A to 2C, according to an example embodiment, will be described with reference to FIGS. 11A to 11M.

Figure 11A:
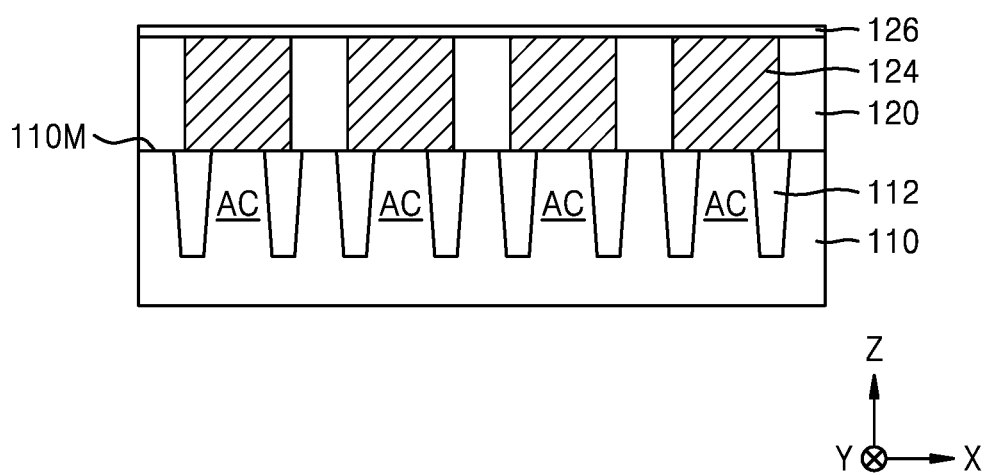

Referring to FIG. 11A, a lower structure 120 and conductive regions 124 may be formed on a substrate 110 in which active regions AC are defined by device isolation regions 112. The conductive regions 124 may pass through the lower structure 120 and be connected to the active regions AC. Thereafter, an insulating film 126 may be formed to cover the lower structure 120 and the conductive region 124.

The insulating film 126 may be used as an etch stop layer during a subsequent process. The insulating film 126 may include an insulating material having an etch selectivity with respect to the lower structure 120. In example embodiments, the insulating film 126 may include a silicon nitride film, a silicon carbon nitride film, a boron-containing silicon nitride film, or a combination thereof.

Figure 11B:
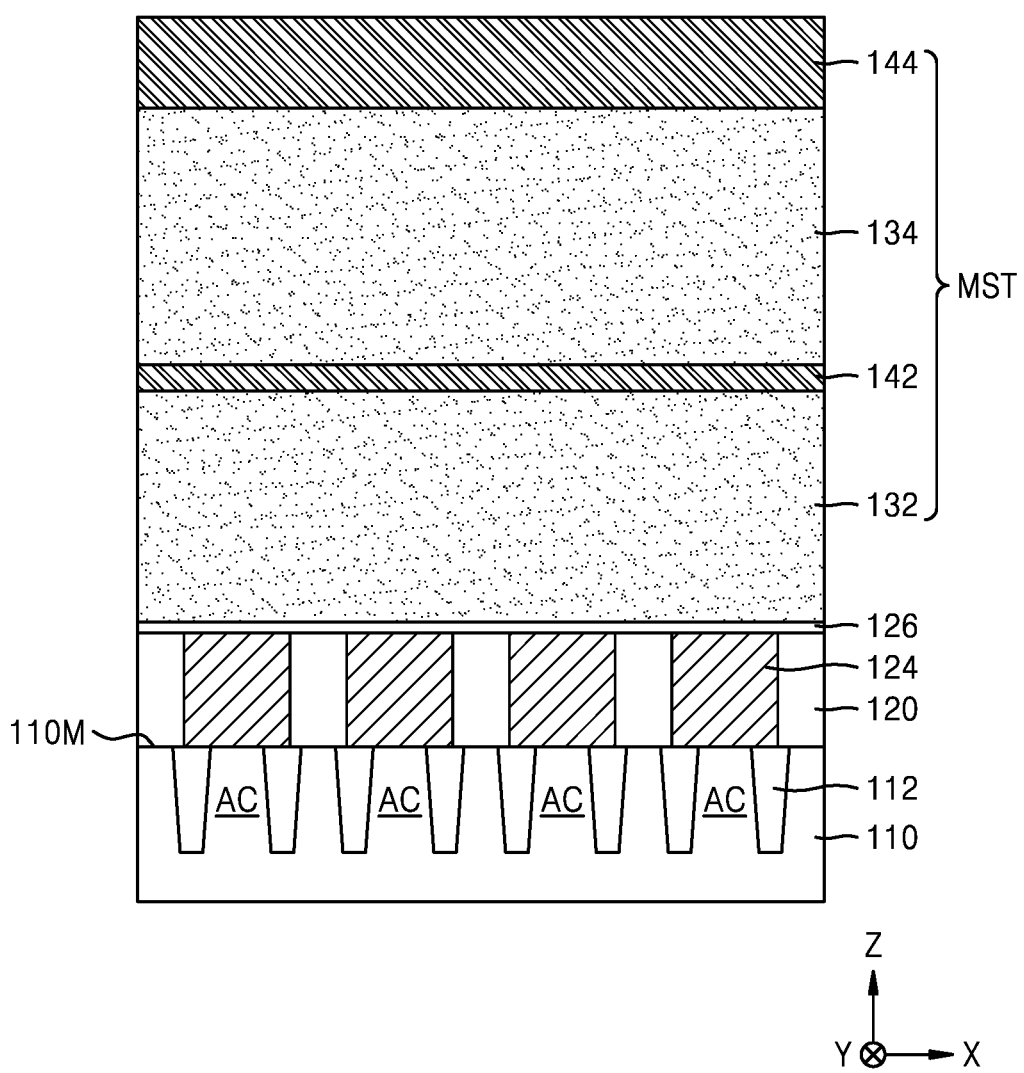

Referring to FIG. 11B, a mold structure MST may be formed on the insulating film 126.

The mold structure MST may include a plurality of mold films and a plurality of support films. For example, the mold structure MST may include a lower mold film 132, a lower support film 142, an upper mold film 134, and an upper sacrificial support film 144, which are sequentially stacked on the insulating film 126. Each of the lower mold film 132 and the upper mold film 134 may include a material, which may have a relatively high etch rate with respect to an etchant including ammonium fluoride ($NH_4F$), hydrofluoric acid (HF), and water and be removed by a lift-off process using the etchant. In example embodiments, the lower mold film 132 and the upper mold film 134 may include an oxide film, a nitride film, or a combination thereof. For example, the lower mold film 132 may include a boro phospho silicate glass (BPSG) film. The BPSG film may include at least one of a first portion in which a concentration of a dopant B (e.g., boron (B)) is variable in a thickness direction of the BPSG film and a second portion in which a concentration of a dopant P (e.g., phosphorus (P)) is variable in the thickness direction of the BPSG film. The upper mold film 134 may include a multilayered insulating film formed by alternately and repeatedly stacking a silicon oxide film and a silicon nitride film, which have relatively small thicknesses, one by one a plurality of times. A specific structure of the mold structure MST is not limited to the above description and may be variously modified and changed within the scope of the inventive concept. An uppermost surface of the mold structure MST may include an oxide etch stop film. The oxide etch stop film may be used as, for example, an etch stop film during a process of wet etching an upper sacrificial support pattern 144P described below with reference to FIG. 11F.

Each of the lower support film 142 and the upper sacrificial support film 144 may include a silicon nitride film, a silicon carbon nitride film, a boron-containing silicon nitride film, or a combination thereof. In example embodiments, the lower support film 142 may include the same material as the upper sacrificial support film 144. In other example embodiments, the lower support film 142 may include a different material from the upper sacrificial support film 144. A thickness of the upper sacrificial support film 144 may be greater than a thickness of the lower support film 142, but the inventive concept is not limited thereto, and each of the lower support film 142 and the upper sacrificial support film 144 may be formed to various thicknesses as needed.

Figure 11C:
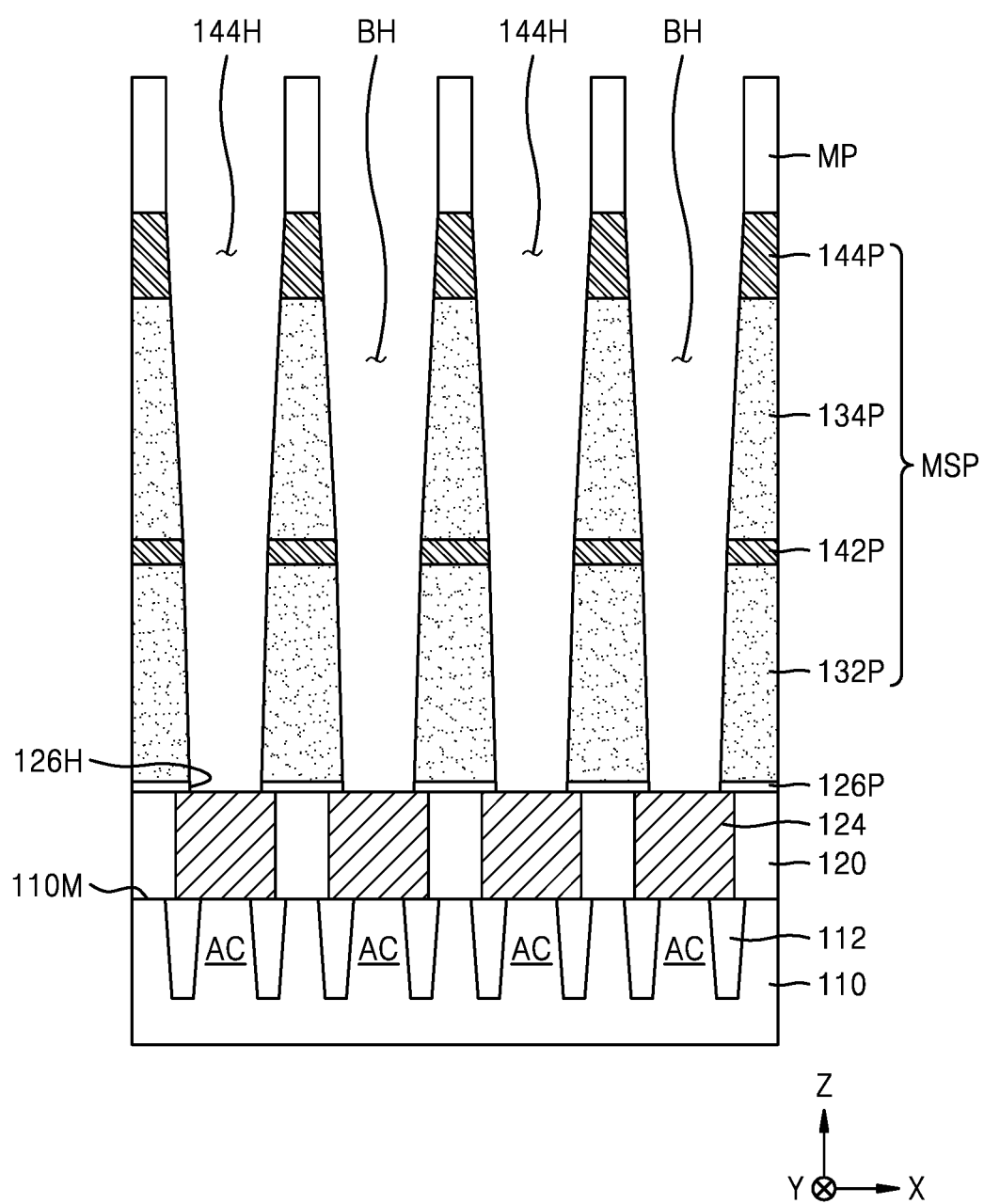

Referring to FIG. 11C, a mask pattern MP may be formed on the mold structure MST in the resultant structure of FIG. 11B. Thereafter, the mold structure MST may be anisotropically etched using the mask pattern MP as an etch mask and using the insulating film 126 as an etch stop layer, thereby forming a mold structure pattern MSP including a plurality of holes BH. The mold structure pattern MSP may include a lower mold pattern 132P, a lower support pattern 142P, an upper mold pattern 134P, and the upper sacrificial support pattern 144P.

The mask pattern MP may include a nitride film, an oxide film, a polysilicon film, a photoresist film, or a combination thereof. A process of forming the plurality of holes BH may further include wet processing the resultant structure obtained by anisotropically etching the mold structure MST. During the processes of anisotropically etching the mold structure MST and wet processing the resultant structure, portions of the insulating film 126 may be etched together. Thus, an insulating pattern 126P having a plurality of openings 126H exposing the conductive regions 124 may be obtained. The wet processing process according to an example embodiment may be performed using an etchant including a diluted sulfuric acid peroxide (DSP) solution.

During the process of wet processing the resultant structure obtained by anisotropically etching the mold structure MST using the etchant, a wet etched amount of the lower mold film 132 may increase in a direction toward the substrate 110. For example, when the lower mold film 132 includes a BPSG film and the concentration of the dopant B or the concentration of the dopant P in the BPSG film increases in the direction toward the substrate 110, an etched amount of the lower mold film 132 due to the etchant may increase in the direction toward the substrate 110. Thus, the etched amount of the lower mold film 132 due to the etchant may be larger near a bottom surface of the lower mold film 132 than near a top surface of the lower mold film 132. Accordingly, after the plurality of holes BH are formed, sidewalls of the lower mold pattern 132P, which are exposed at the plurality of holes BH, may extend away from the substrate 110 in a direction closer to a normal line to a main surface of the substrate 110 than sidewalls of the upper mold pattern 134P, which are exposed at the plurality of holes BH.

Figure 11D:
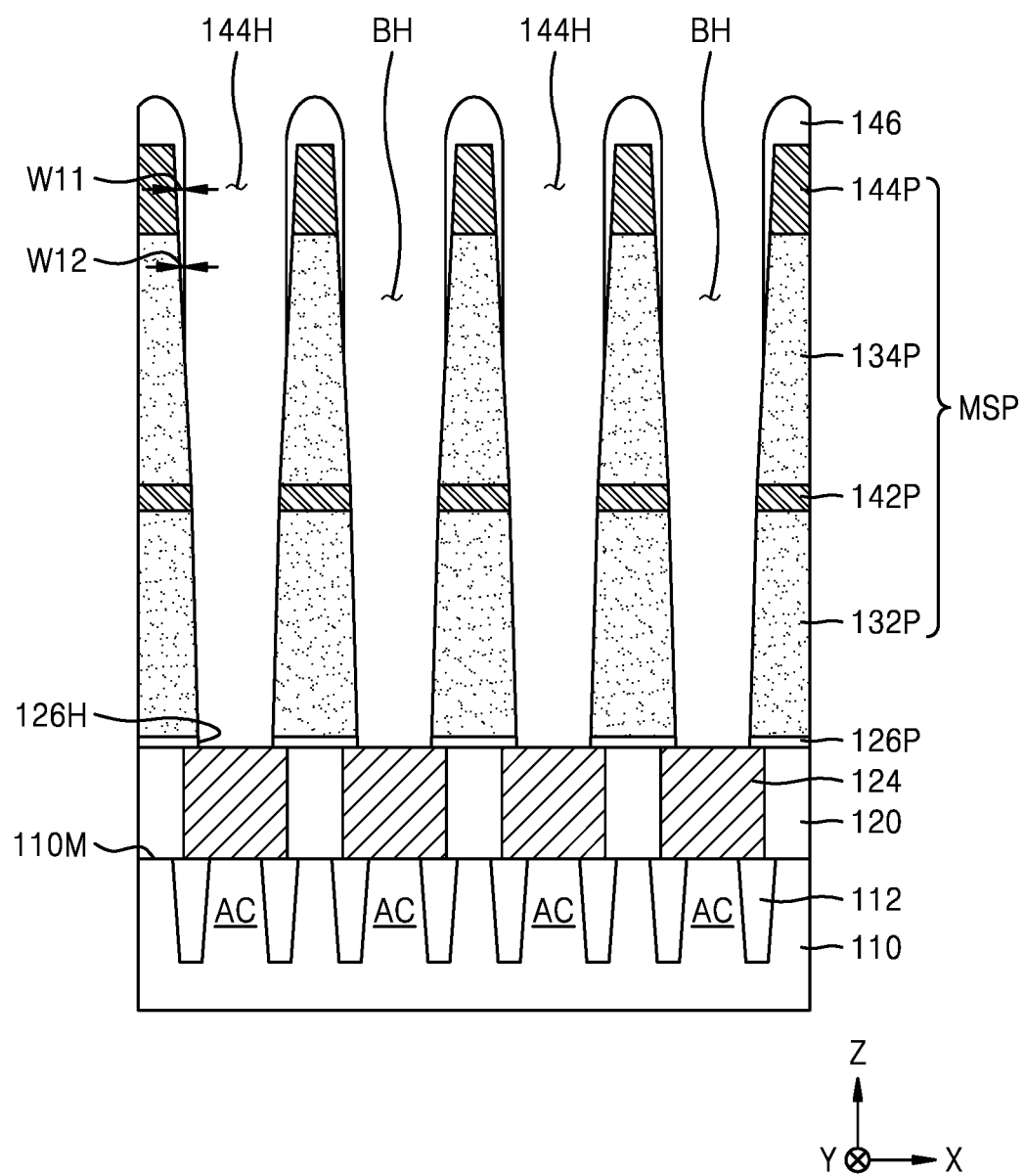

Referring to FIG. 11D, the mold pattern MP may be removed from the resultant structure of FIG. 11C, and a plurality of sacrificial spacers 146 may be formed to cover upper portions of the mold structure pattern MSP inside and outside each of the plurality of holes BH.

The plurality of sacrificial spacers 146 may include a silicon nitride film, a silicon oxide film, or a combination thereof. The plurality of sacrificial spacers 146 may not be conformally formed on the mold structure pattern MSP but may be formed to exhibit degraded step coverage on the mold structure pattern MSP. The plurality of sacrificial spacers 146 may be formed using a chemical vapor deposition (CVD) process or a plasma-enhanced CVD (PECVD) process. By controlling a deposition atmosphere (e.g., temperature, pressure, and plasma formation conditions) for forming the plurality of sacrificial spacers 146 or by controlling flow rates of source gases in consideration of sticking coefficients of atoms that will be included in the sacrificial spacers 146, the plurality of sacrificial spacers 146 may be formed to cover only upper portions of the mold structure pattern MSP. The plurality of sacrificial spacers 146 may cover the mold structure pattern MSP to a greater thickness or width in a direction farther away from the substrate 110. A width W11 of portions of the plurality of sacrificial spacers 146, which cover sidewalls of the upper sacrificial support pattern 144P, may be greater than a width W12 of portions of the plurality of sacrificial spacers 146, which cover sidewalls of the upper mold pattern 134P.

In example embodiments, the upper sacrificial support pattern 144P may include the same material as the plurality of sacrificial spacers 146. For example, each of the upper sacrificial support pattern 144P and the plurality of sacrificial spacers 146 may include a silicon nitride film. In other example embodiments, the upper sacrificial support pattern 144P may include a different material from the plurality of sacrificial spacers 146. For instance, the upper sacrificial support pattern 144P may include a silicon nitride film, and the plurality of sacrificial spacers 146 may include a silicon oxide film.

Figure 11E:
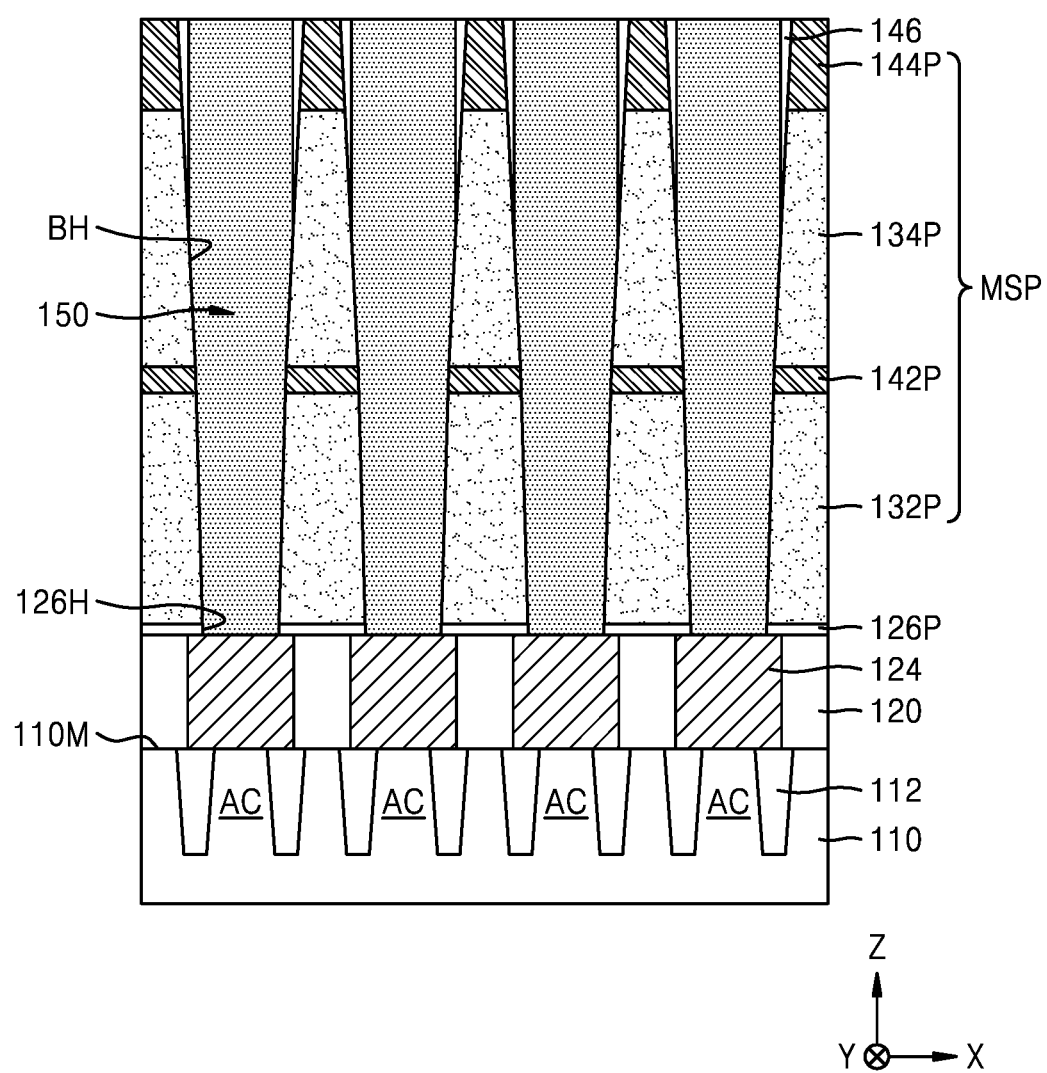

Referring to FIG. 11E, a conductive layer may be formed to fill the plurality of holes BH and cover top surfaces of the plurality of sacrificial spacers 146 in the resultant structure of FIG. 11D. Thereafter, the conductive layer and the plurality of sacrificial spacers 146 may be planarized to expose a top surface of the upper sacrificial support pattern 144P. Thus, a plurality of conductive patterns 150 including portions of the conductive layer, which remain inside the plurality of holes BH, may be formed. The conductive layer and the plurality of sacrificial spacers 146 may be planarized using an etchback process or a chemical mechanical polishing (CMP) process.

After the plurality of conductive patterns 150 are obtained, a portion of each of the plurality of sacrificial spacers 146 may remain between the plurality of conductive patterns 150 and the mold structure pattern MSP. Each of the plurality of sacrificial spacers 146 remaining on the substrate 110 may have a ring shape covering an upper sidewall of the conductive pattern 150. For example, each of the plurality of sacrificial spacers 146 may surround an upper sidewall of the conductive pattern 150. A distance between upper portions of the respective conductive patterns 150 may be increased due to the plurality of sacrificial spacers 146.

The plurality of conductive patterns 150 may include a metal film, a conductive metal oxide film, a conductive metal nitride film, a conductive metal oxynitride film, or a combination thereof. In example embodiments, the conductive pattern 150 may include Ti, Ti oxide, Ti nitride, Ti oxynitride, Co, Co oxide, Co nitride, Co oxynitride, Nb, Nb oxide, Nb nitride, Nb oxynitride, Sn, Sn oxide, Sn nitride, Sn oxynitride, or a combination thereof. For example, the conductive pattern 150 may include TiN, CoN, NbN, $SnO_2$, or a combination thereof, but is not limited thereto. The formation of the plurality of conductive patterns 150 may be performed using a CVD process, a PECVD process, a metal organic CVD (MOCVD) process, or an atomic layer deposition (ALD) process.

Figure 11F:
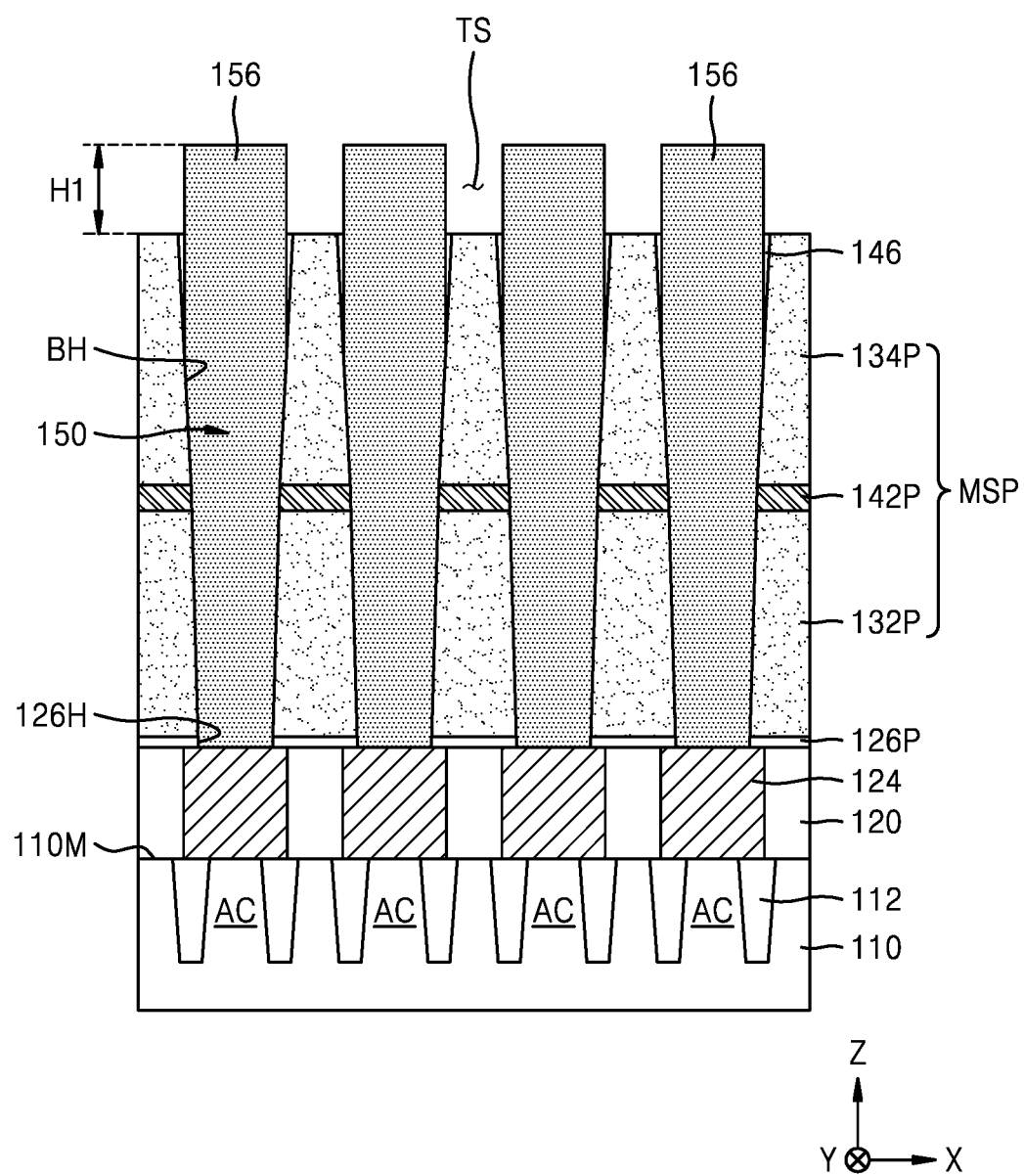

Referring to FIG. 11F, a portion of each of the upper sacrificial support pattern 144P and the plurality of sacrificial spacers 146 may be removed from the resultant structure of FIG. 11E using a wet etching process, thereby forming a peripheral space TS exposing a sidewall of a top portion 156 of each of the plurality of conductive patterns 150.

The wet etching process may be performed using an etchant containing phosphoric acid, an etchant containing ammonium fluoride, hydrofluoric acid, and water, or a combination thereof. The wet etching process may be performed using the upper mold pattern 134P as an etch stop layer.

After the peripheral space TS is formed, a top surface of the upper mold pattern 134P and a top surface of each of the plurality of sacrificial spacers 146 may be exposed at a bottom surface of the peripheral space TS. After the upper sacrificial support pattern 144P is removed, the top portion 156 of each of the plurality of conductive patterns 150 may protrude by a first height H1 above the top surface of the upper mold pattern 134P.

Figure 11G:
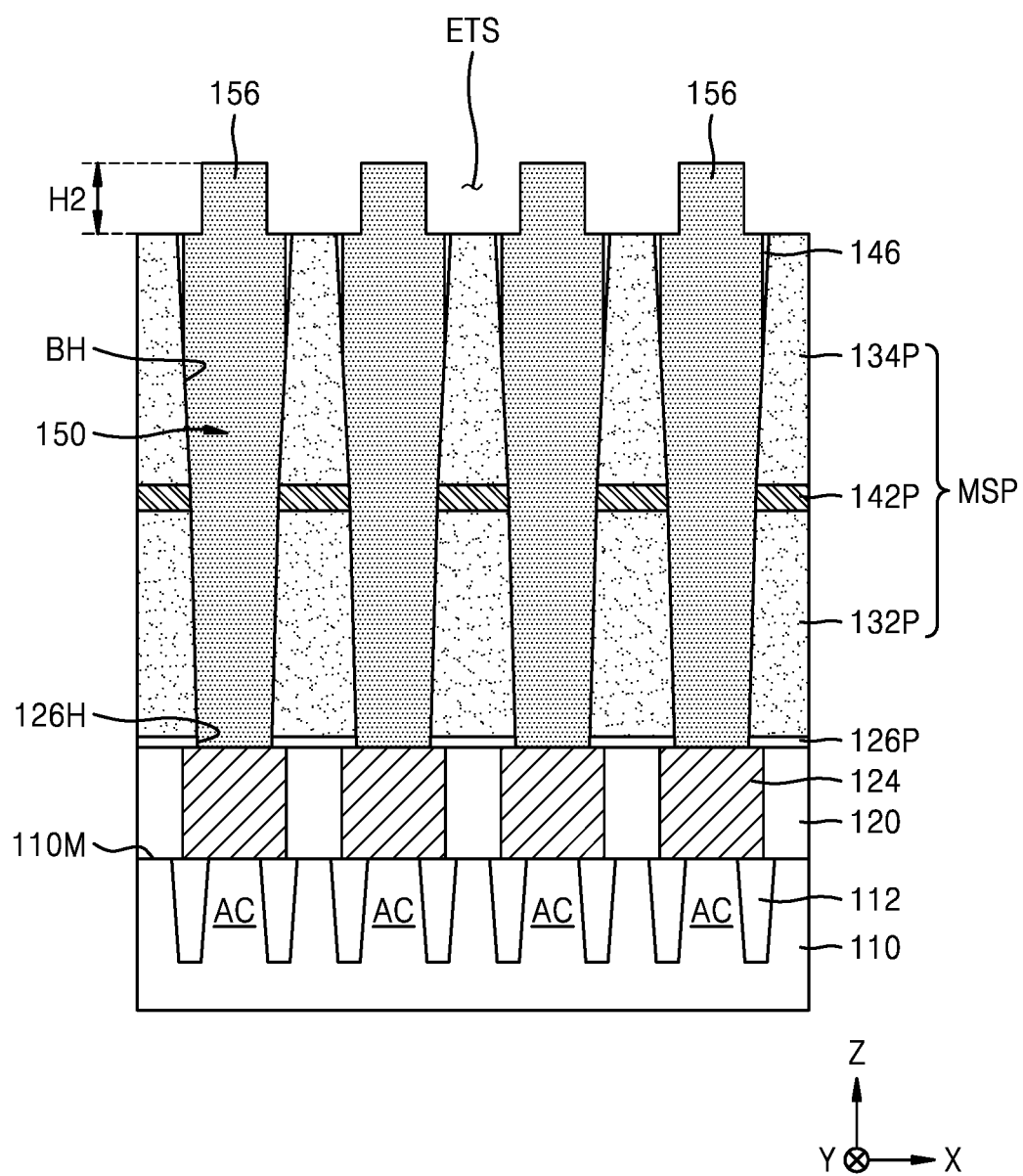

Referring to FIG. 11G, the top portion 156 of each of the plurality of conductive patterns 150, which protrudes above the top surface of the upper mold pattern 134P, may be trimmed in the resultant structure of FIG. 11F. Thus, a width and height of the top portion 156 may be reduced to form an enlarged peripheral space ETS.

The trimming process may be performed using an etchant capable of selectively etching only the plurality of conductive patterns 150, from among the upper mold pattern 134P, the plurality of sacrificial spacers 146, and the plurality of conductive patterns 150, which are exposed on the substrate 110. For example, when each of the upper mold pattern 134P and the plurality of sacrificial spacers 146 includes a silicon oxide film, a silicon nitride film, or a combination thereof and the plurality of conductive patterns 150 include TiN, an etchant including sulfuric acid and oxygenated water may be used in the trimming process. After the trimming process is performed, the top portion 156 of each of the plurality of conductive patterns 150 may protrude above the top surface of the upper mold pattern 134P by a second height H2, which is less than the first height H1, and a distance between the respective top portions 156 of the plurality of conductive patterns 150 may be increased.

Figure 11H:
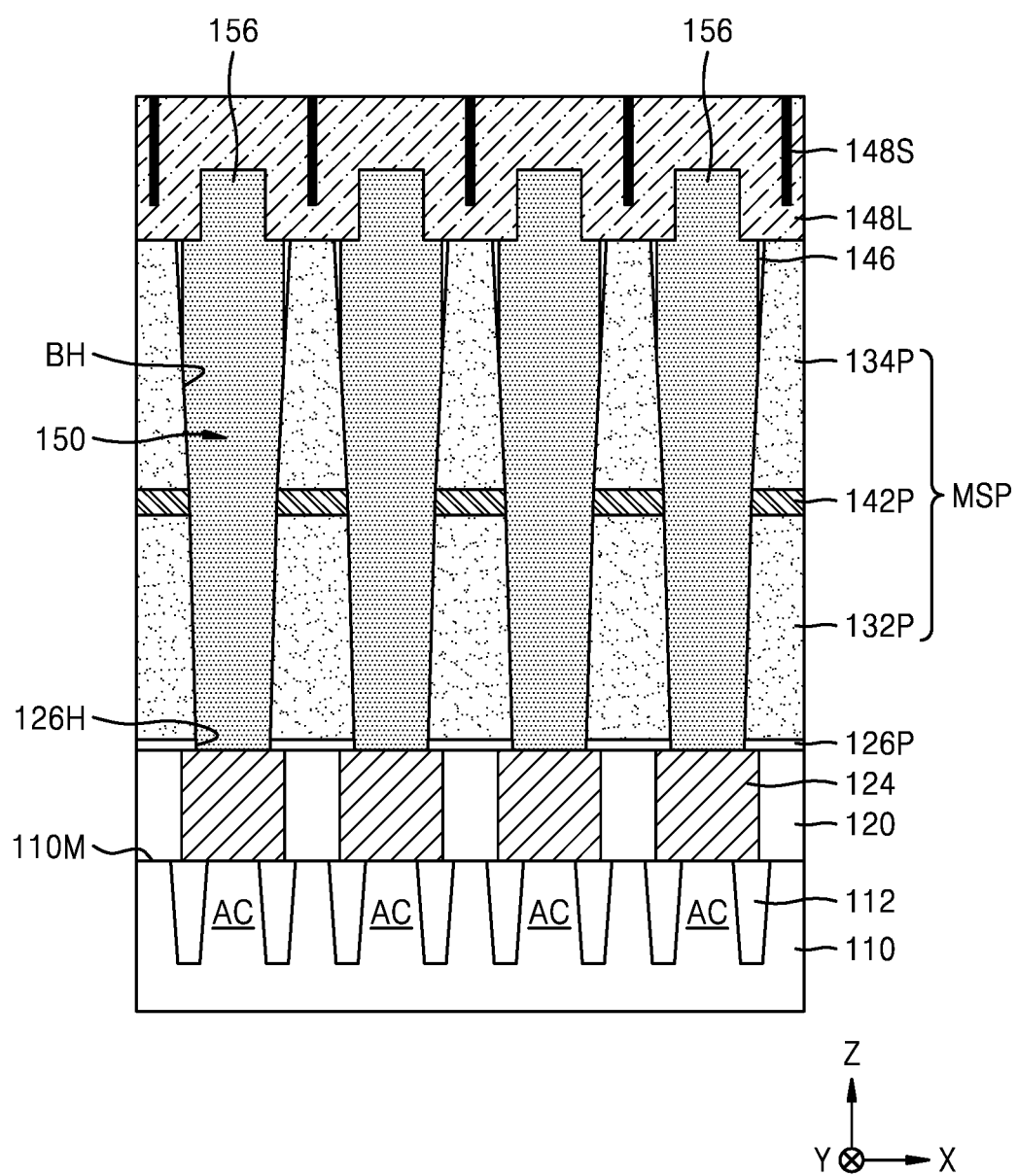

Referring to FIG. 11H, an upper support film 148L may be formed on the resultant structure of FIG. 11G to fill the enlarged peripheral space ETS and cover the top portion 156 of each of the plurality of conductive patterns 150.

The upper support film 148L may be formed using a CVD process or an ALD process. During the formation of the upper support film 148L, a seam portion 148S may be formed in a region of the upper support film 148L between the top portions 156. The seam portion 148S may have a line shape extending lengthwise in a vertical direction. During the deposition of the upper support film 148L, a material layer included in the upper support film 148L may be grown to a uniform thickness, and the enlarged peripheral space ETS may be filled with the material layer during the growth of the material layer. As a result, portions of the material layer, which are grown from sidewalls of the top portions 156 while facing each other, may come into contact with each other in the enlarged peripheral space ETS, and thus, the seam portion 148S may be formed. For example, the seam portion 148S may be a boundary formed by the contact of two adjacent portions of the material layer. The seam portion 148S may continuously or intermittently extend in an approximately vertical direction in an approximately central portion of a space between two top portions 156, which are opposite each other across the enlarged peripheral space ETS.

The upper support film 148L may include a material having an etch selectivity with respect to the lower mold pattern 132P and the upper mold pattern 134P. In example embodiments, the upper support film 148L may include a silicon nitride film, a SiOC film, a SiCN film, a SiBN film, a SiBCN film, or a combination thereof, but is not limited thereto.

Figure 11I:
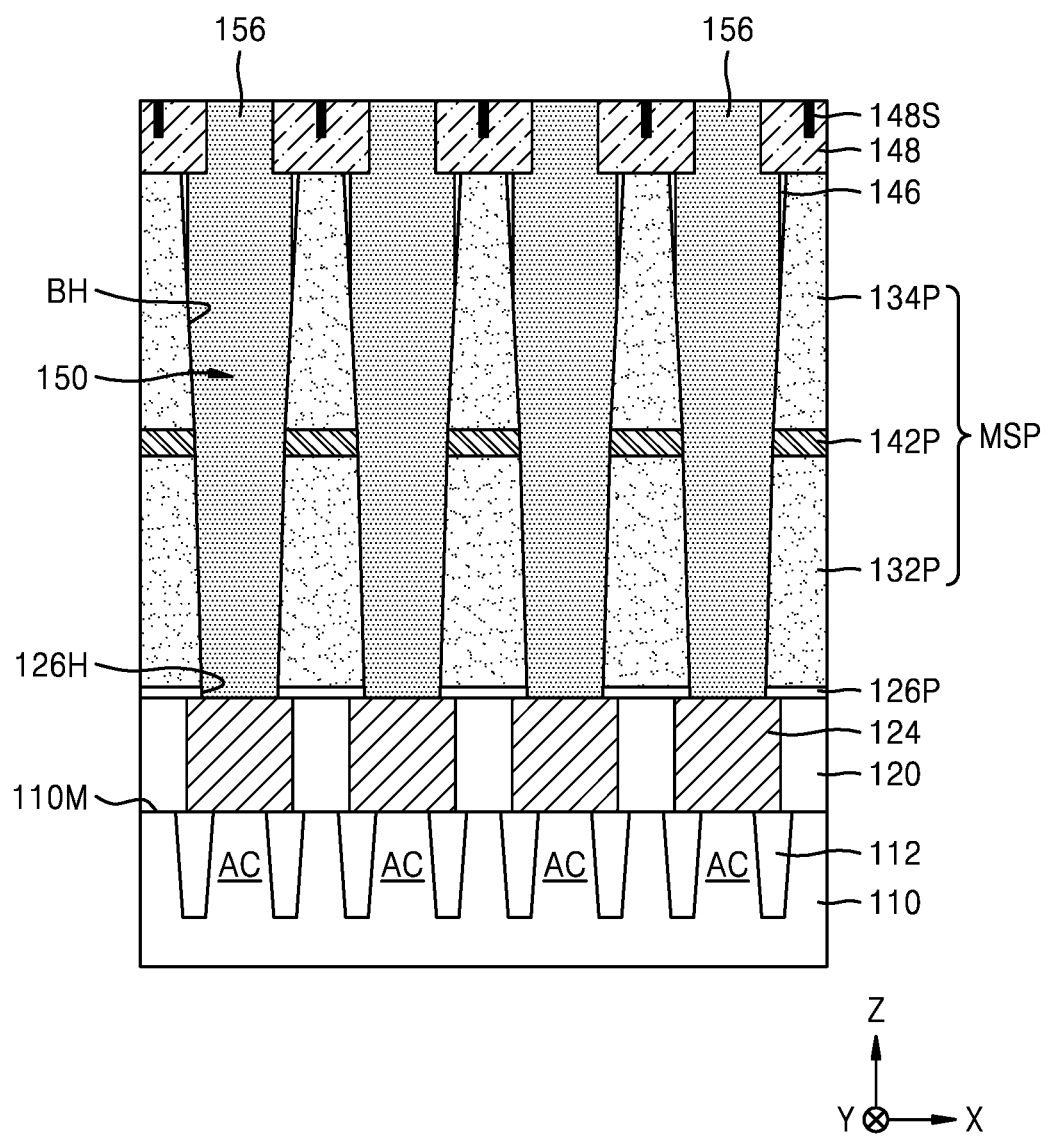

Referring to FIG. 11I, portions of the upper support film 148L may be removed from the resultant structure of FIG. 11H to expose the top portion 156 of each of the plurality of conductive patterns 150, thereby forming an upper support pattern 148.

The formation of the upper support pattern 148 may include removing a portion of the upper support film 148L by performing a CMP process using the top portion 156 of each of the plurality of conductive patterns 150 as a polishing stop layer. As a result, the upper support pattern 148, which includes portions of the upper support film 148L, which fill the enlarged peripheral spaces (see, e.g., enlarged peripheral spaces ETS in FIG. 11G) between the respective conductive patterns 150, may be obtained.

Figure 11J:
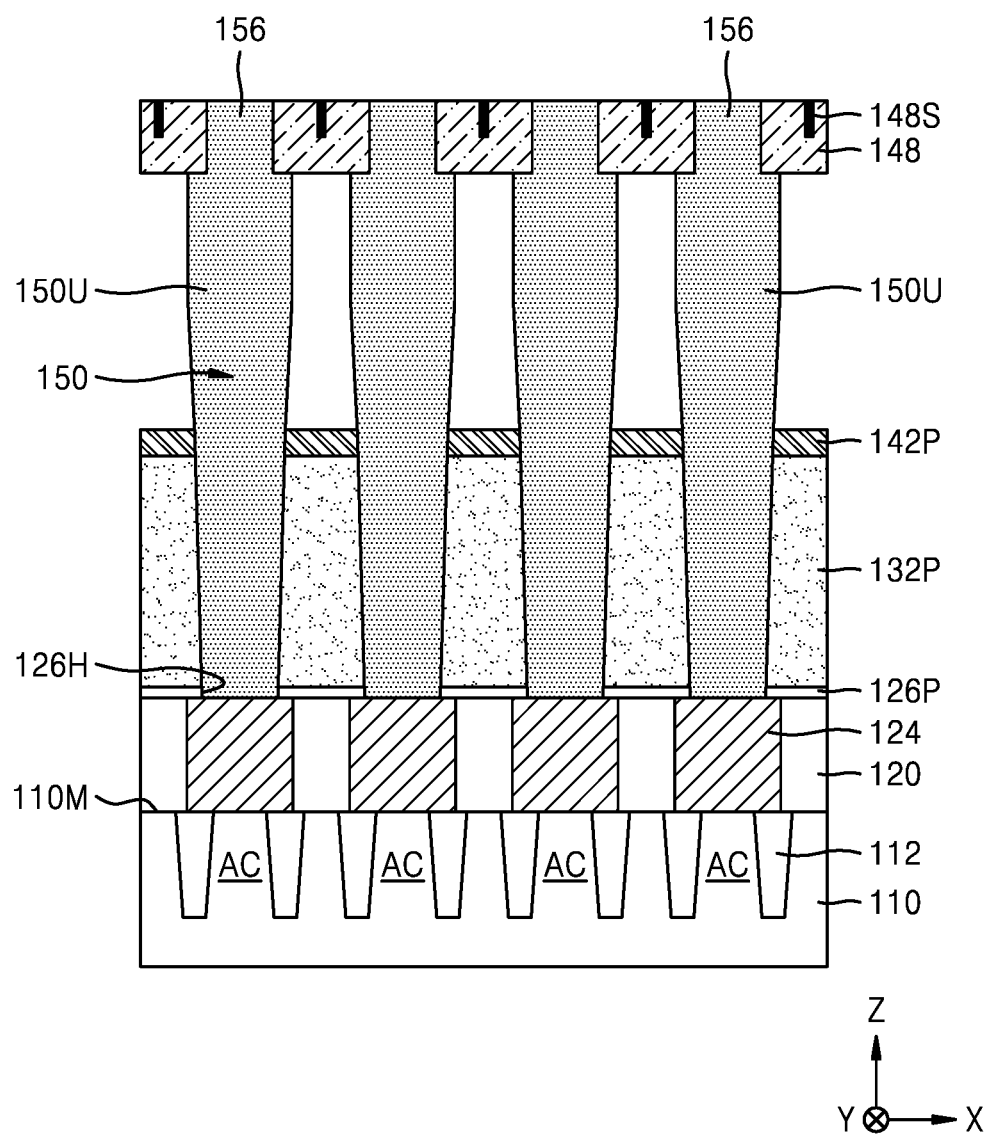

Referring to FIG. 11J, a plurality of upper holes UH (see, e.g., upper holes UH in FIG. 2A) may be formed in the upper support pattern 148, and the upper mold pattern 134P and the sacrificial spacers 146 may be wet removed through the plurality of upper holes UH. After the upper mold pattern 134P and the sacrificial spacers 146 are removed, sidewalls of a first portion 150U, which is an upper portion of each of the plurality of conductive patterns 150, may be exposed.

When each of the upper mold pattern 134P and the sacrificial spacers 146 includes an oxide film, the upper mold pattern 134P and the sacrificial spacers 146 may be removed using a first etchant containing ammonium fluoride, hydrofluoric acid, and water. When the upper mold pattern 134P includes an oxide film and the sacrificial spacers 146 include a nitride film, the upper mold pattern 134P may be removed using the first etchant, and the exposed sacrificial spacers 146 may be removed using a second etchant containing phosphoric acid.

Figure 11K:
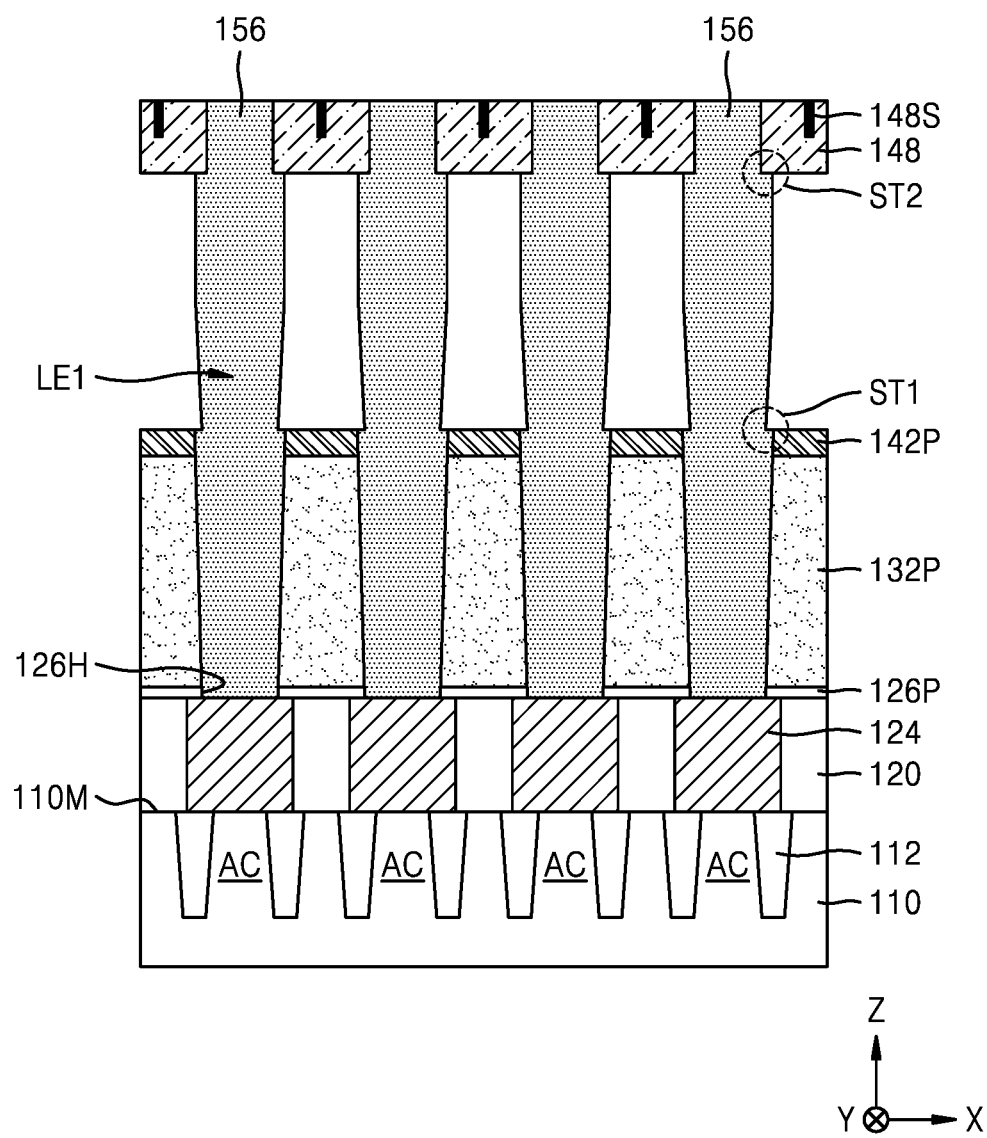

Referring to FIG. 11K, the first portion 150U of each of the plurality of conductive patterns 150 may be trimmed in the resultant structure of FIG. 11J, thereby reducing a width of the first portion 150U in the lateral direction.

In example embodiments, the trimming of the first portion 150U may be performed using an etchant capable of selectively etching only the plurality of conductive patterns 150, from among the upper support pattern 148, the lower support pattern 142P, and the plurality of conductive patterns 150. For instance, when the upper support pattern 148 and the lower support pattern 142P include a nitride film and the plurality of conductive patterns 150 include TiN, an etchant including sulfuric acid and oxygenated water may be used in the trimming process. After the first portion 150U is trimmed, a lower electrode LE1 having a sidewall with a first step portion ST1 and a second step portion ST2 may be obtained.

Figure 11L:
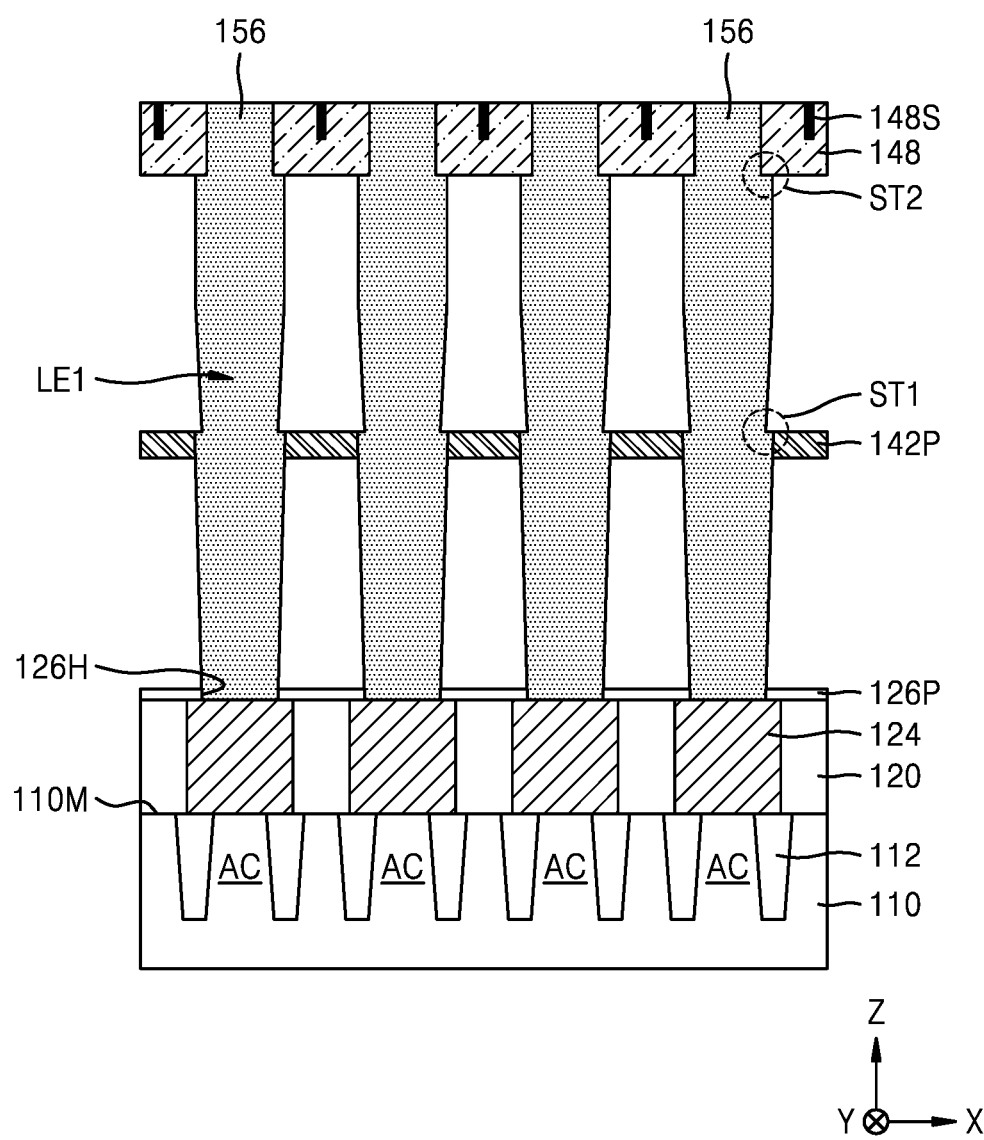

Referring to FIG. 11L, portions of the lower support pattern 142P, which are exposed through the plurality of upper holes (see, e.g., upper holes UH in FIG. 2A) formed in the upper support pattern 148, may be removed from the resultant structure of FIG. 11K to form a plurality of lower holes (not shown). Thereafter, the lower mold pattern 132P may be wet removed through the plurality of lower holes to remove a top surface of the insulating pattern 126P. The lower mold pattern 132P may be removed using the same method as the process of removing the upper mold pattern 134P, which is described with reference to FIG. 11J. After the lower mold pattern 132P is removed, a sidewall of a lower portion of the lower electrode LE1 may be exposed.

Figure 11M:
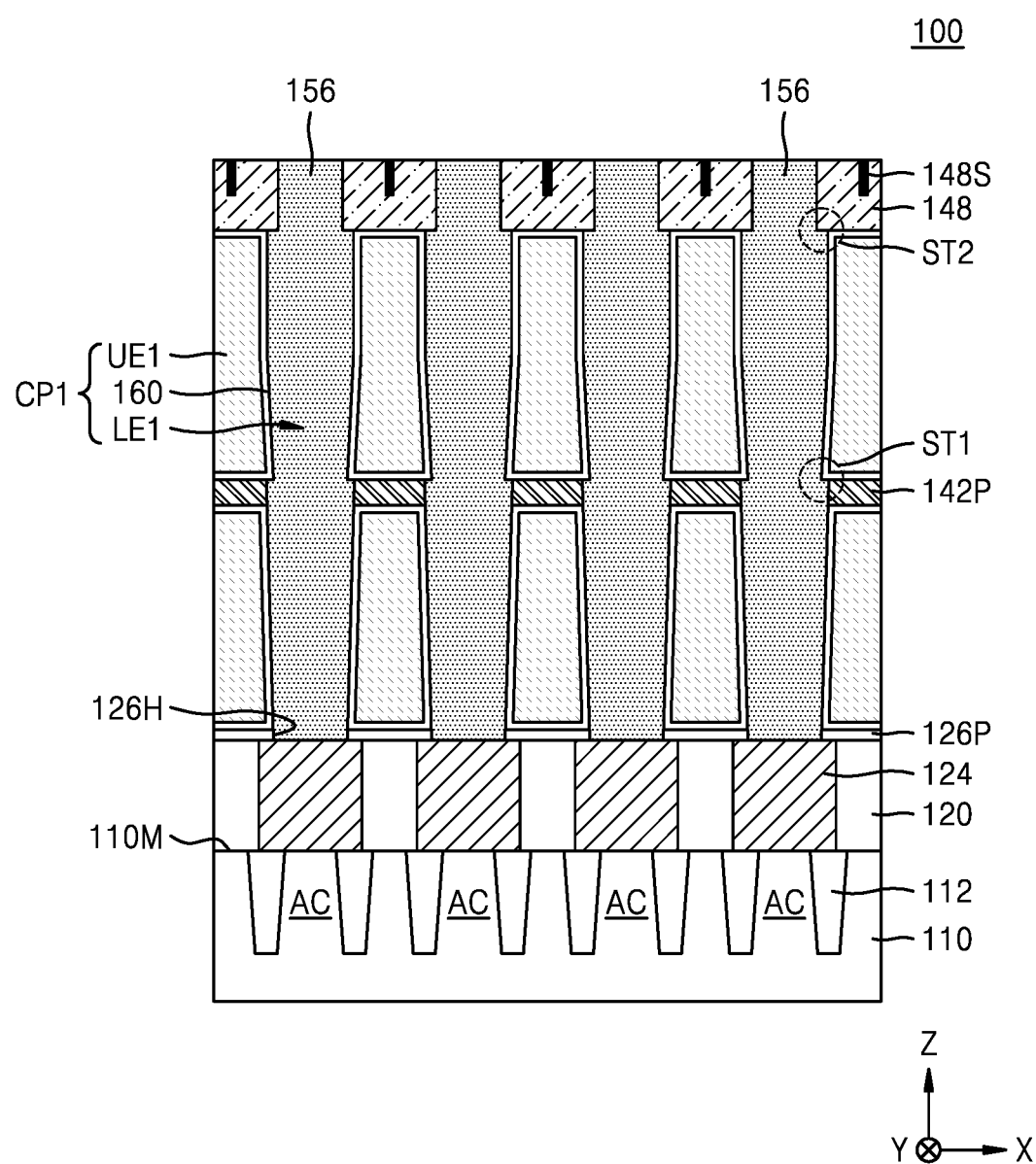

Referring to FIG. 11M, a dielectric film 160 may be formed to cover exposed surfaces of the lower electrode LE1 in the resultant structure of FIG. 11L. The dielectric film 160 may be formed using an ALD process. Afterwards, an upper electrode UE1 may be formed to cover the dielectric film 160, thereby completing the manufacture of the IC device 100 shown in FIGS. 2A to 2C. The upper electrode UE1 may be formed using a CVD process, an MOCVD process, a physical vapor deposition (PVD) process, or an ALD process.

According to the method of manufacturing the IC device 100 described with reference to FIGS. 11A to 11M, even if an aspect ratio of the plurality of lower electrodes LE1 is relatively high and a distance between the respective lower electrodes LE1 is reduced an insulation distance between upper portions of the respective lower electrodes LE1 may be increased. Thus, failures caused by a bridge phenomenon between adjacent lower electrodes LE1 may be inhibited, and the reliability and mass production efficiency of the IC device 100 may be improved.

FIGS. 12A to 12D are cross-sectional views illustrating a process sequence of a method of manufacturing an IC device according to example embodiments. A method of manufacturing the IC device 200 shown in FIG. 3, according to an example embodiment, will be described with reference to FIGS. 12A to 12D.

Figure 12A:
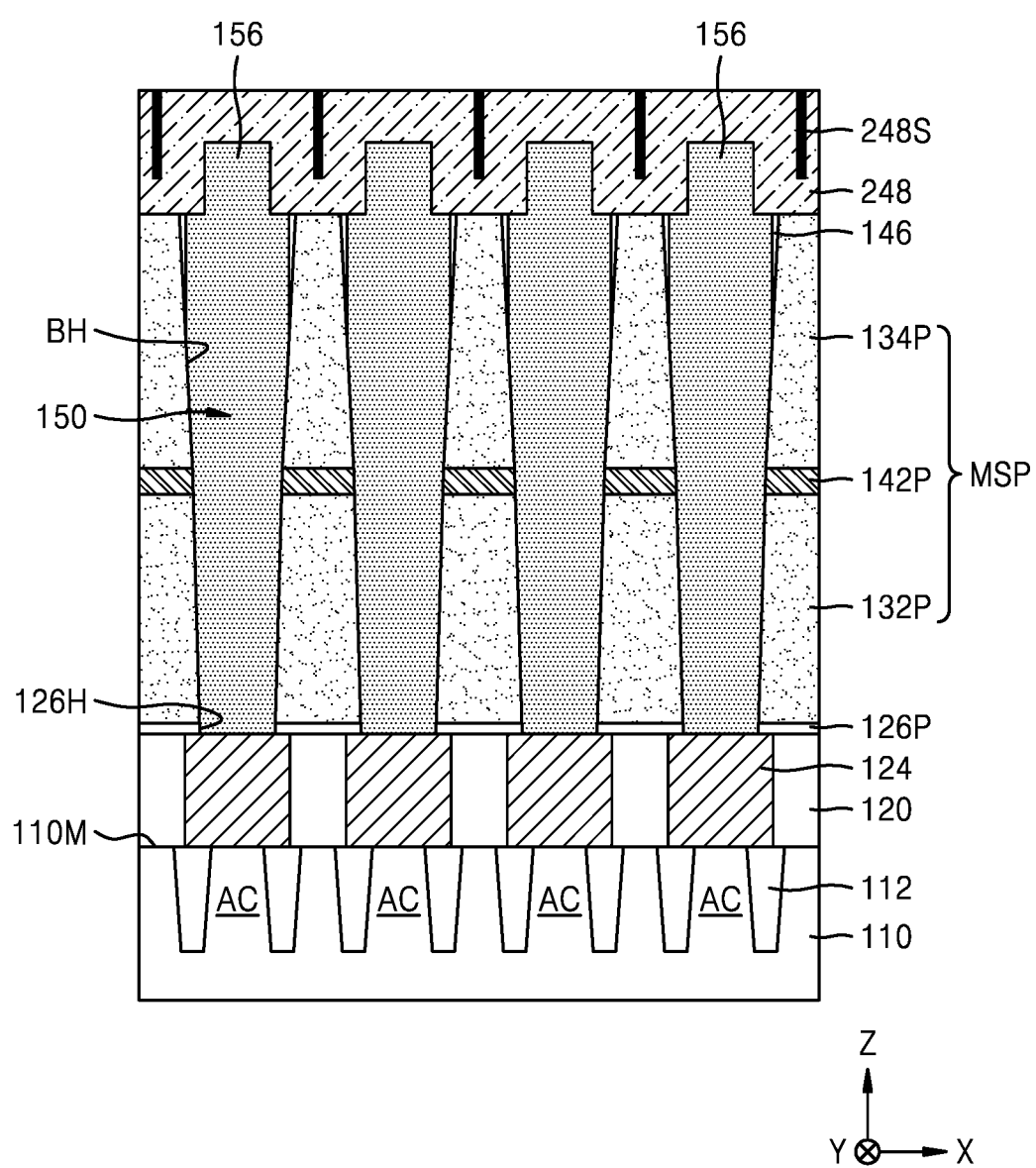
FIGS. 12A to 12D are cross-sectional views illustrating a process sequence of a method of manufacturing an IC device, according to example embodiments.

Referring to FIG. 12A, the processes described with reference to FIGS. 1A to 11H may be performed. Thus, after the process of forming the upper support film 148L is performed, an upper support pattern 248 may be formed on the resultant structure of FIG. 11H. The upper support pattern 248 may have a top surface, which is planarized by polishing the top surface of the upper support film 148L of FIG. 11H by a partial thickness. The seam portion 148S of the upper support film 148L, which is described with reference to FIG. 11H, may remain as a seam portion 248S of the upper support pattern 248. The upper support pattern 248 may fill the enlarged peripheral spaces (see, e.g., enlarged peripheral spaces ETS in FIG. 11G) and cover a top surface of a top portion 156 of each of a plurality of conductive patterns 150.

Since the upper support pattern 248 extends in a lateral direction between the top portions 156 of the respective conductive patterns 150 while covering a sidewall and the top surface of the top portion 156 of each of the plurality of conductive patterns 150, a position of each of the plurality of conductive patterns 150 may be stably fixed without changing a position of the top portion 156 of each of the plurality of conductive patterns 150 due to stress of peripheral films or without degrading the arrangement regularity of the plurality of conductive patterns 150.

Figure 12B:
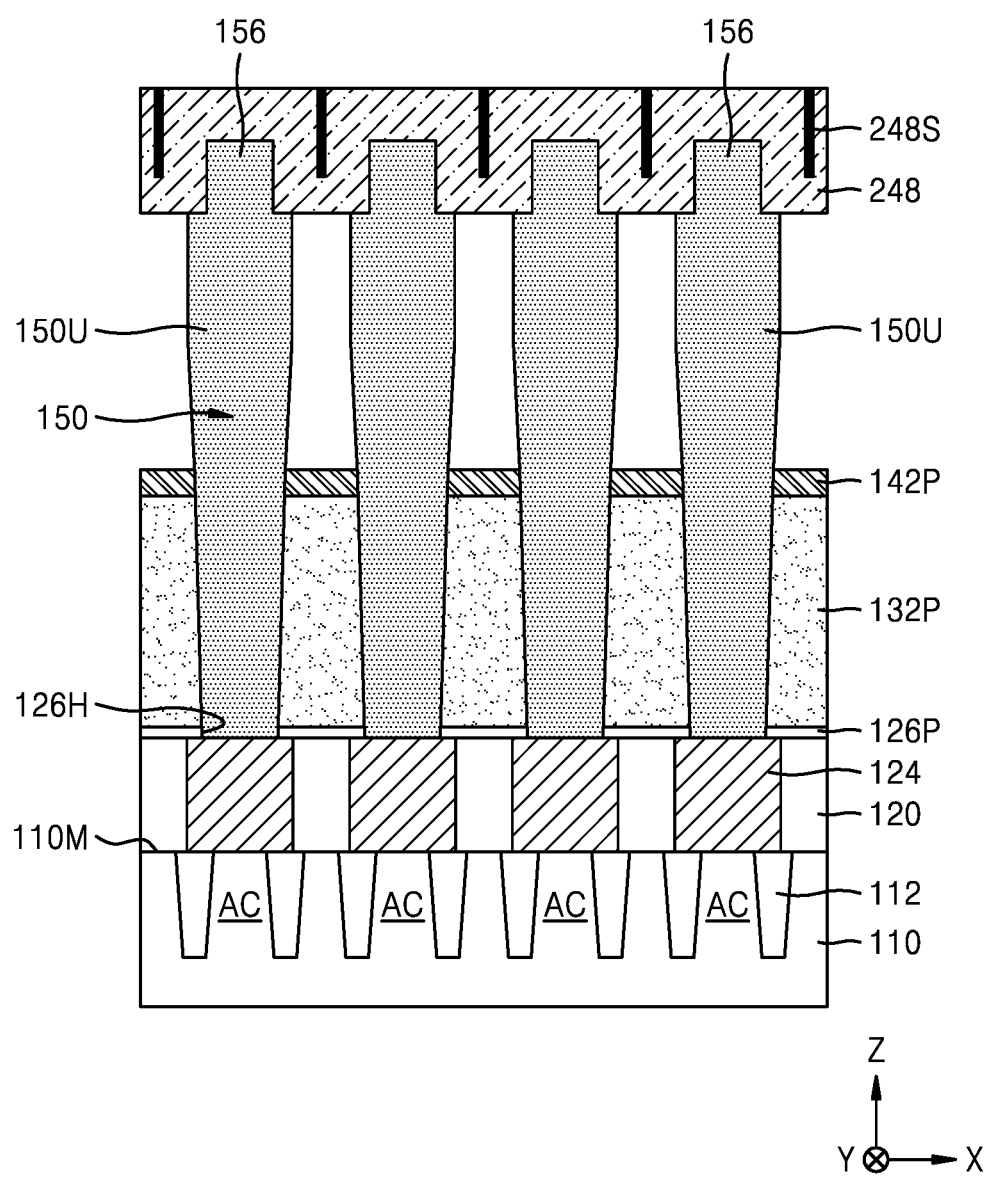

Referring to FIG. 12B, a plurality of upper holes (not shown) may be formed in the upper support pattern 248 using a method similar to that described with reference to FIG. 11J. Thereafter, an upper mold pattern 134 and sacrificial spacers 146 may be removed through the plurality of upper holes, thereby exposing sidewalls of first portions 150U.

Figure 12C:
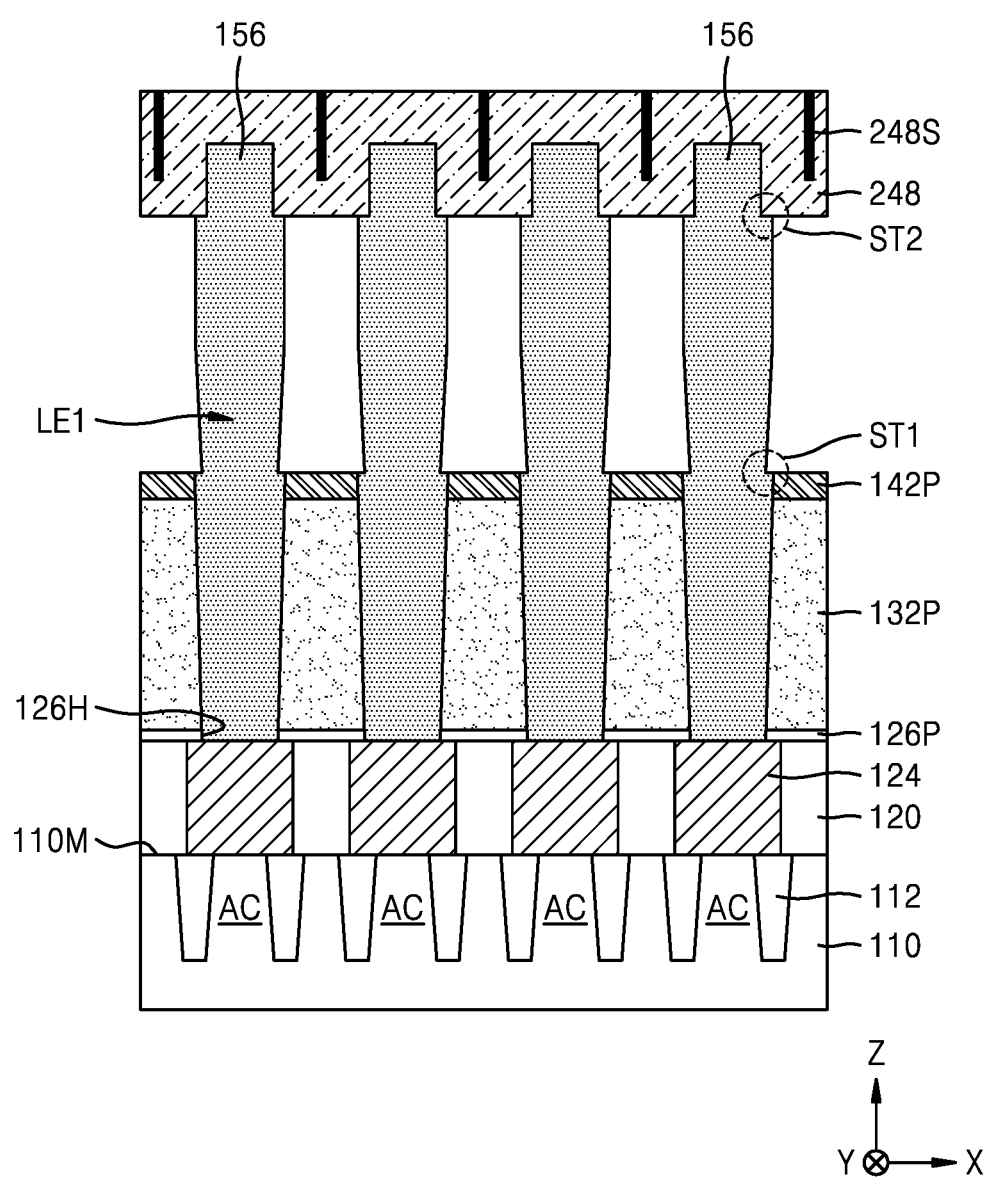

Referring to FIG. 12C, the first portion 150U of each of the plurality of conductive patterns 150 may be trimmed in the resultant structure of FIG. 12B using the same method as described with reference to FIG. 11K. Thus, a lateral width of the first portion 150U may be reduced, thereby forming a lower electrode LE1 having a sidewall with a first step portion ST and a second step portion ST2.

Figure 12D:
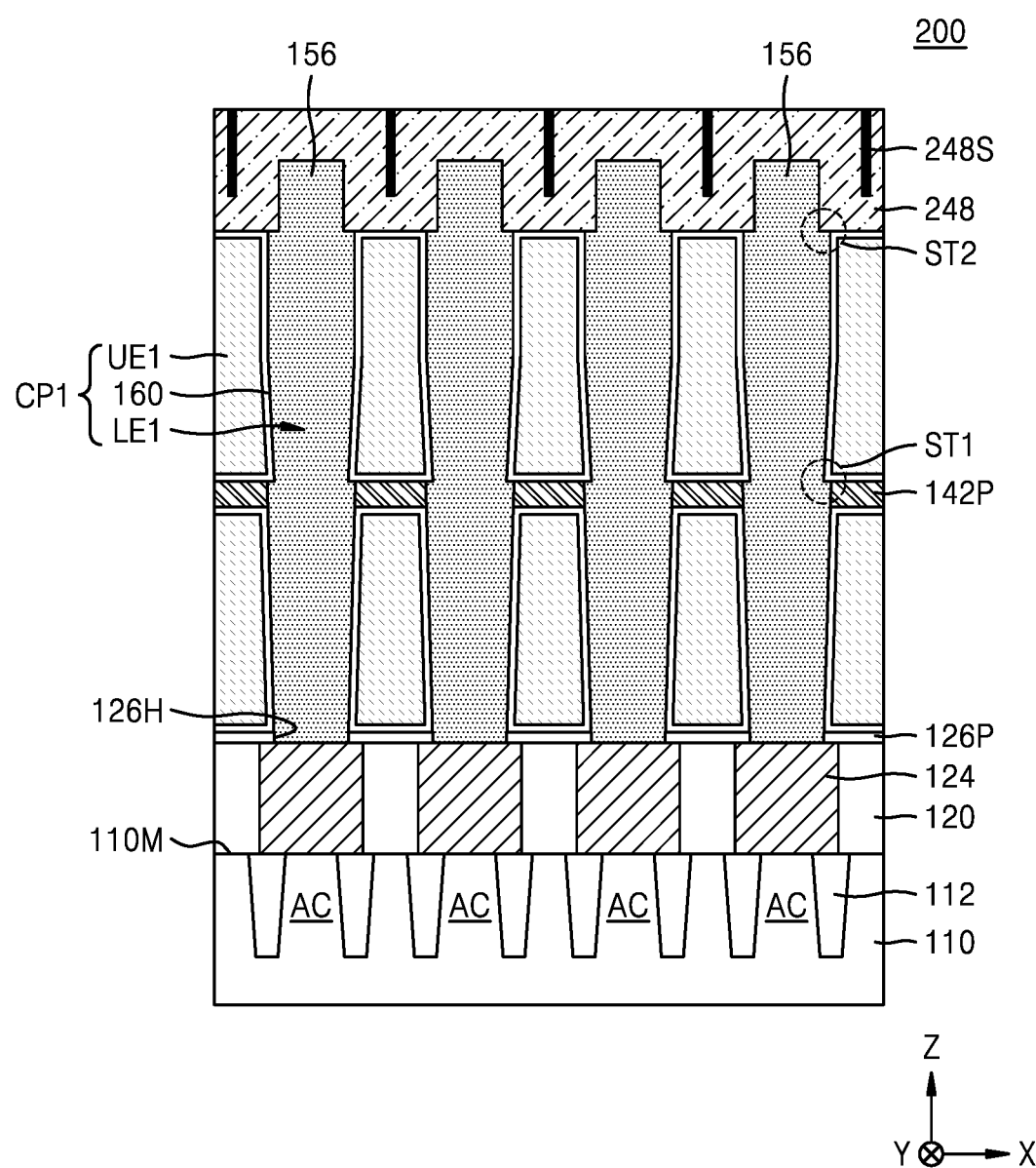

Referring to FIG. 12D, a lower mold pattern 132P may be removed from the resultant structure of FIG. 12C using the same method as described with reference to FIG. 11L. A dielectric film 160 and an upper electrode UE1 may be formed on the lower electrode LE1 using the same method as described with reference to FIG. 11M, thereby forming the IC device 200.

FIGS. 13A to 13D are cross-sectional views illustrating a process sequence of a method of manufacturing an IC device according to example embodiments. A method of manufacturing the IC device 300 shown in FIGS. 4A and 4B, according to an example embodiment, will be described with reference to FIGS. 13A to 13D.

Figure 13A:
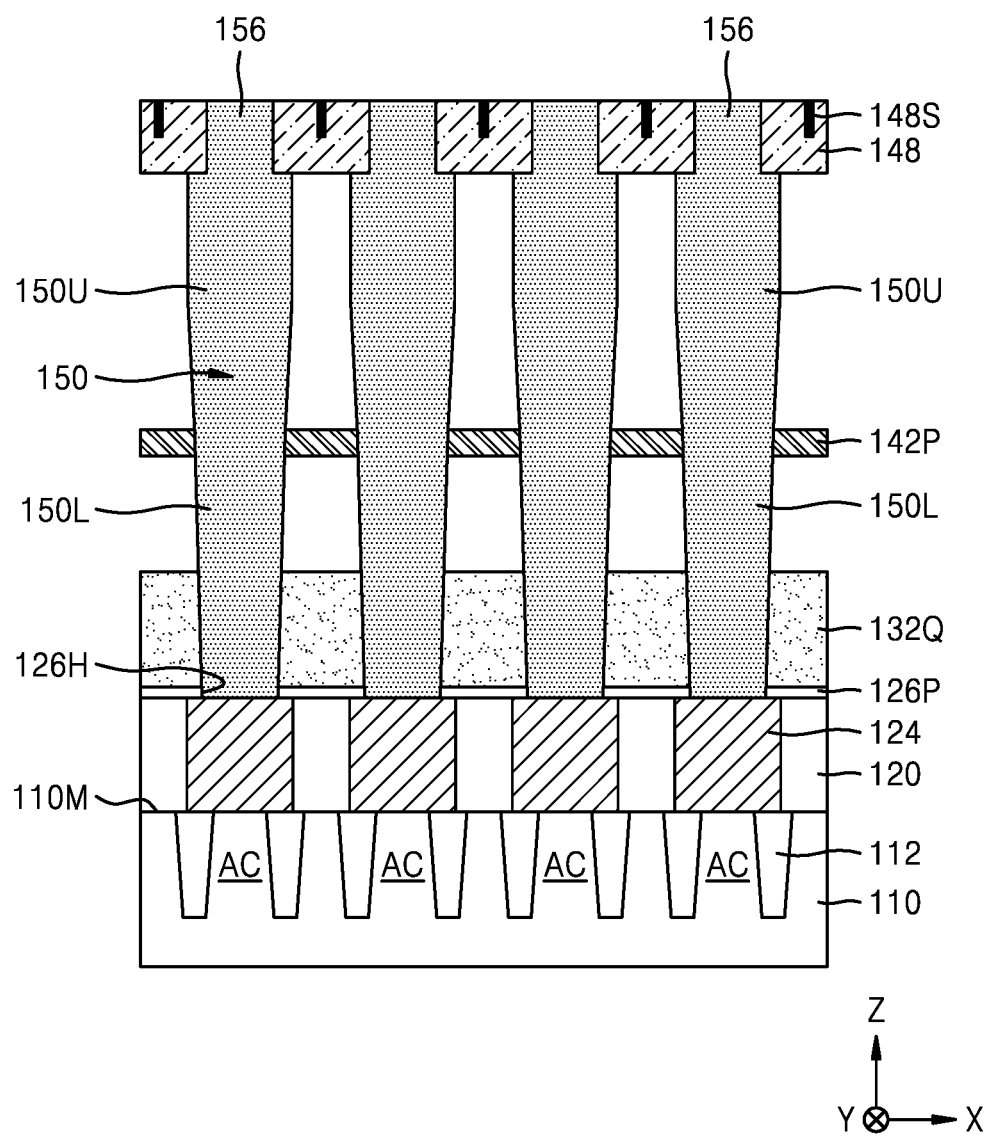
FIGS. 13A to 13D are cross-sectional views illustrating a process sequence of a method of manufacturing an IC device, according to example embodiments.

Referring to FIG. 13A, the processes described with reference to FIGS. 11A to 11J may be performed. Thereafter, portions of a lower support pattern 142P may be removed from the resultant structure of FIG. 11J to form a plurality of lower holes (not shown). Afterwards, a portion of a lower mold pattern 132P may be wet removed through the plurality of lower holes to form a lowered lower mold pattern 132Q. The process of wet removing the portion of the lower mold pattern 132P may be performed using the same method as the process of removing the upper mold pattern 134P, which is described with reference to FIG. 11L.

A second portion 150L, which is a lower portion of each of a plurality of conductive patterns 150, may be exposed between the lowered lower mold pattern 132Q and the lower support pattern 142P.

Figure 13B:
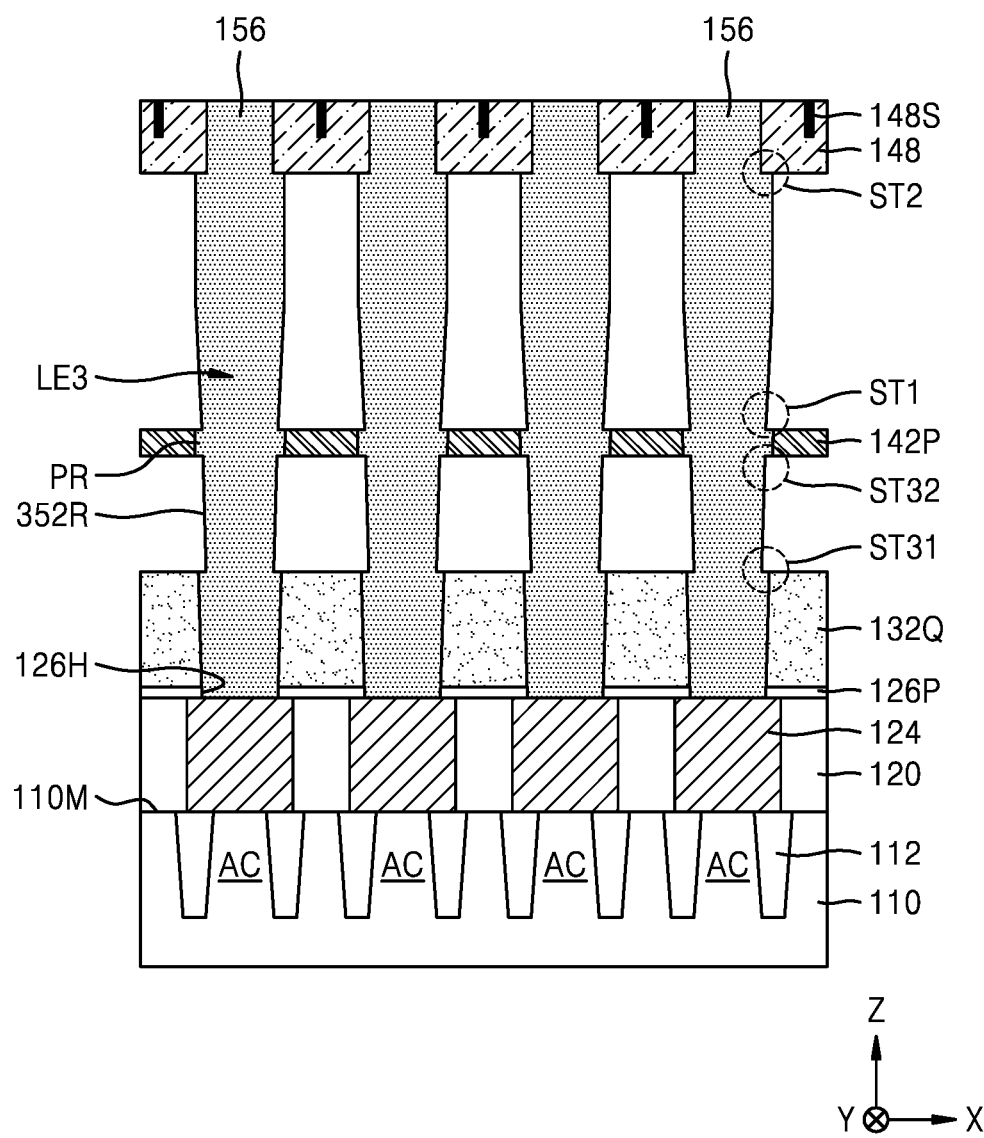

Referring to FIG. 13B, exposed portions of a first portion 150U and the second portion 150L of each of the plurality of conductive patterns 150 may be trimmed in the resultant structure of FIG. 13A using a method similar to that described with reference to FIG. 11K. Thus, a lateral width of each of the first portion 150U and the second portion 150L may be reduced. After the trimming process is performed, a lower electrode LE3 having a sidewall with a first step portion ST1, a second step portion ST2, and a plurality of third step portions (e.g., ST31 and SR32) may be obtained.

Figure 13C:
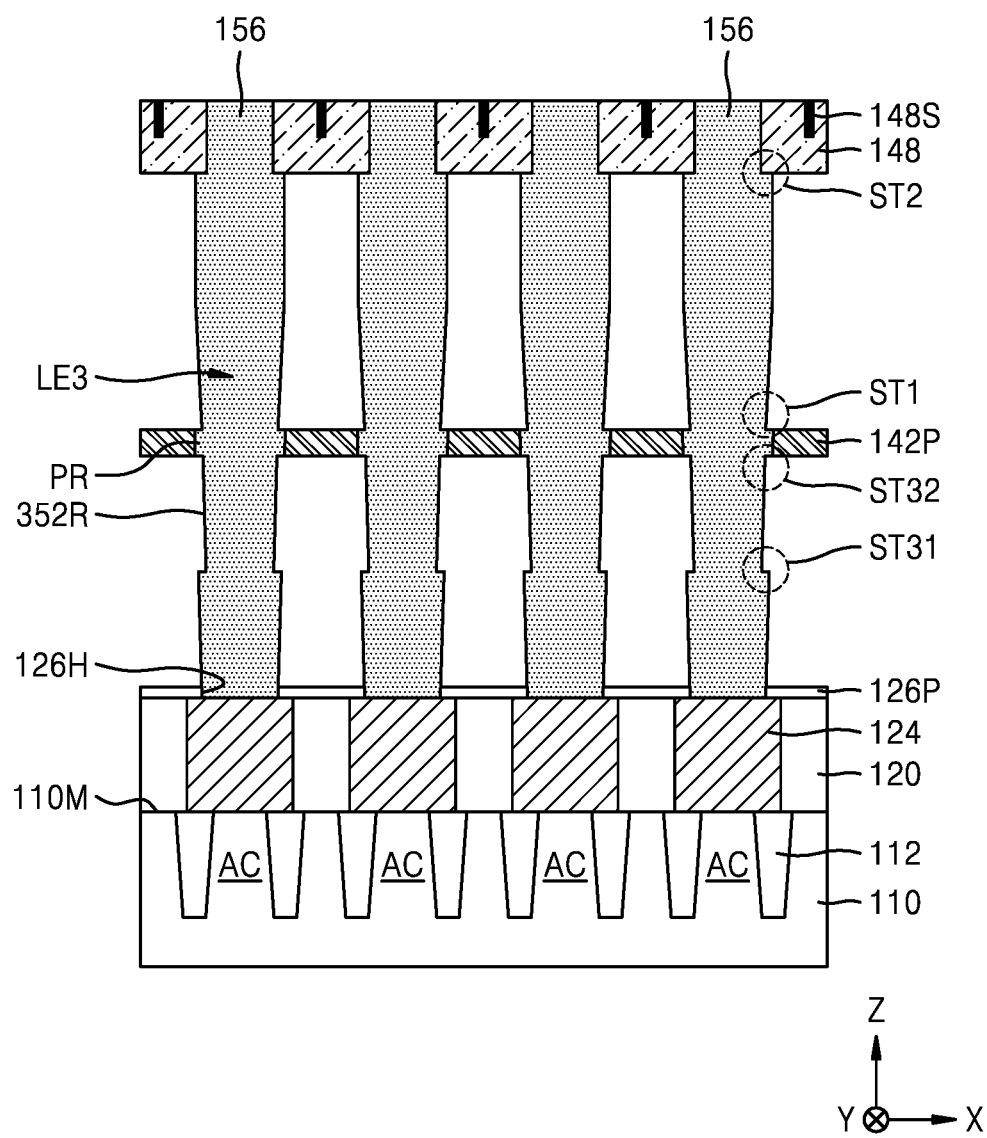

Referring to FIG. 13C, the lowered lower mold pattern 132Q may be wet removed through the plurality of lower holes (not shown) formed in the lower support pattern 142P from the resultant structure of FIG. 13B, thereby exposing a top surface of an insulating pattern 126P. The process of removing the lowered lower mold pattern 132Q may be performed using the same method as the process of removing the upper mold pattern 134P, which is described with reference to FIG. 11J.

Figure 13D:
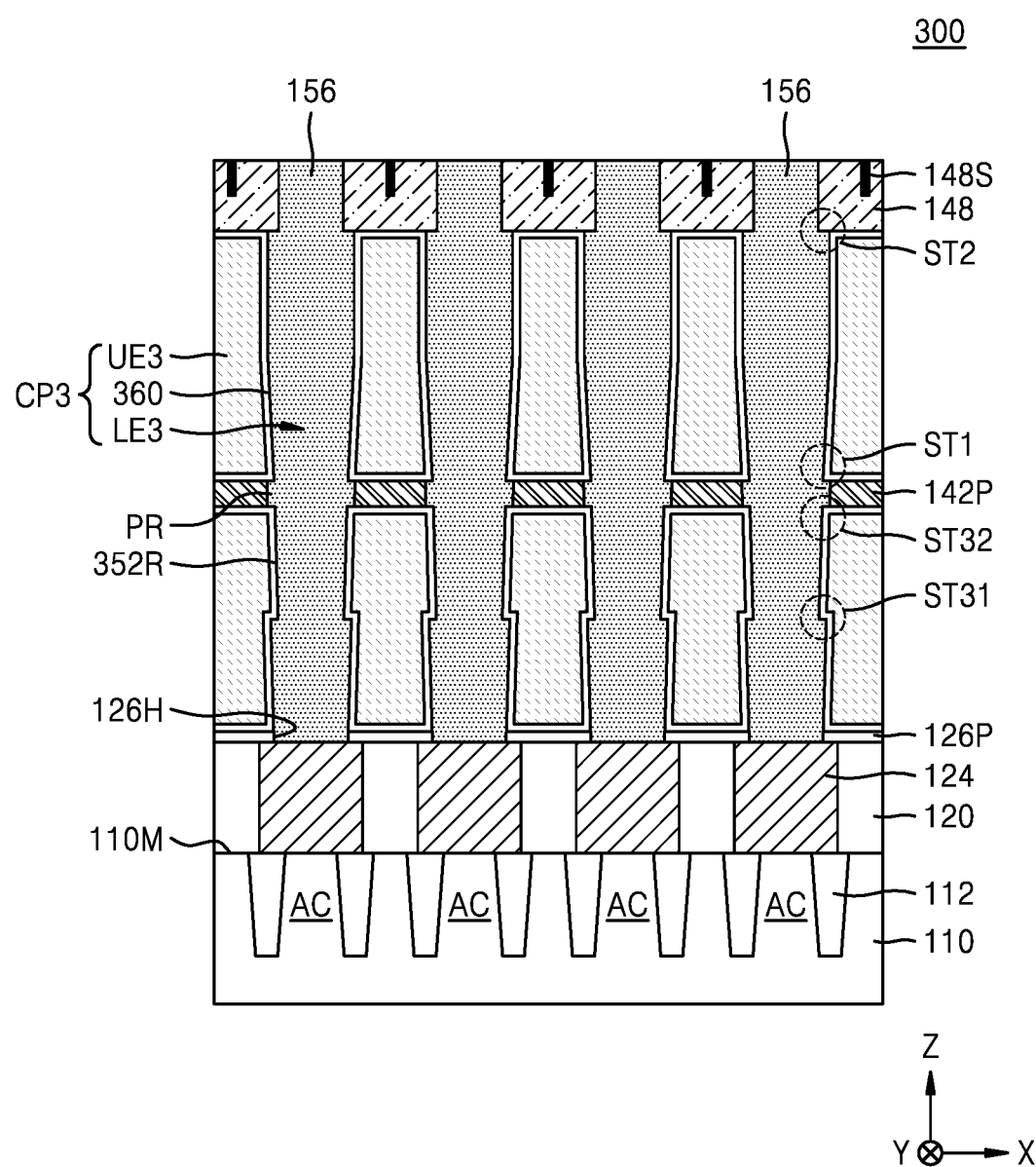

Referring to FIG. 13D, a dielectric film 360 may be formed on the resultant structure of FIG. 13C to cover exposed surfaces of the lower electrode LE3. An upper electrode UE3 may be formed on the dielectric film 360, thereby completing the manufacture of the IC device 300. The dielectric film 360 and the upper electrode UE3 may be formed using the same method as the processes of forming the dielectric film 160 and the upper electrode UE1, which are described with reference to FIG. 11M.

Although the methods of manufacturing the IC devices 100, 200, and 300 shown in FIGS. 2A to 2C, 3, 4A, and 4B have been described with reference to FIGS. 11A to 11M, 12A to 12D, and 13A to 13D, it will be understood that the IC devices 400, 500, 600, 700, 800, and 900 shown in FIGS. 5 to 10 and various IC devices having structures similar thereto may be manufactured by applying various modifications and changes to the methods described with reference to FIGS. 11A to 11M, 12A to 12D, and 13A to 13D within the scope of the inventive concept.

While the inventive concept has been particularly shown and described with reference to embodiments thereof, it will be understood that various changes in form and details may be made therein without departing from the spirit and scope of the following claims.

What is claimed is:

1. An integrated circuit device comprising:
   a lower electrode comprising a main portion and a top portion, the main portion extending lengthwise in a vertical direction on a substrate and having a sidewall with at least one step portion, and the top portion having a width less than a width of the main portion in a lateral direction; and
   an upper support pattern in contact with the top portion of the lower electrode and extending parallel to the substrate,
   wherein the upper support pattern comprises a seam portion formed inside the upper support pattern at a position spaced apart from the top portion of the lower electrode in the lateral direction.

2. The integrated circuit device of claim 1, further comprising:
   a lower support pattern configured to support the main portion of the lower electrode, wherein the lower electrode comprises a first step portion in contact with the lower support pattern.

3. The integrated circuit device of claim 1,
wherein the lower electrode comprises a first step portion formed in the main portion of the lower electrode and a second step portion formed in a boundary portion between the main portion and the top portion of the lower electrode, and
wherein the upper support pattern is in contact with the second step portion.

4. The integrated circuit device of claim 1, wherein the upper support pattern is in contact with a sidewall of the top portion of the lower electrode, and a top surface of the upper support pattern and a top surface of the top portion of the lower electrode extend on a same plane.

5. The integrated circuit device of claim 1, wherein the upper support pattern is in contact with a sidewall and a top surface of the top portion of the lower electrode, and a vertical distance from the substrate to a top surface of the upper support pattern is greater than a vertical distance from the substrate to the top surface of the top portion of the lower electrode.

6. The integrated circuit device of claim 1, wherein the upper support pattern is in contact with a sidewall and a top surface of the top portion of the lower electrode and comprises a portion extending parallel to the substrate on the top surface of the top portion of the lower electrode.

7. The integrated circuit device of claim 1, further comprising:
a lower support pattern in contact with the main portion of the lower electrode and extending parallel to the substrate,
wherein the lower electrode further comprises a protrusion protruding toward the lower support pattern.

8. An integrated circuit device comprising:
a lower electrode extending lengthwise in a vertical direction from a first level to a second level on a substrate, the lower electrode comprising a first step portion and a top portion, wherein the first step portion is formed at a sidewall of the lower electrode at a third level between the first level and the second level, and the top portion has a top surface at the second level; and
an upper support pattern extending parallel to the substrate at the second level and being in contact with the top portion of the lower electrode to support the lower electrode,
wherein the upper support pattern comprises a seam portion formed inside the upper support pattern at a position spaced apart from the top portion of the lower electrode in a lateral direction.

9. The integrated circuit device of claim 8, further comprising:
a lower support pattern configured to support the lower electrode between the first level and the third level,
wherein the lower support pattern is in contact with the first step portion.

10. The integrated circuit device of claim 8, wherein a lateral width of the top portion of the lower electrode is less than a lateral width of a first portion electrode, the first portion extending in the vertical direction between the first level and the third level.

11. The integrated circuit device of claim 8,
wherein the lower electrode further comprises a second step portion formed at the sidewall of the lower electrode at a fourth level between the second level and the third level,
wherein the top portion of the lower electrode extends from the fourth level to the second level in the vertical direction, and
wherein the upper support pattern is in contact with the second step portion of the lower electrode.

12. The integrated circuit device of claim 8,
wherein the lower electrode further comprises a second step portion formed at the sidewall of the lower electrode at a fourth level between the second level and the third level,
wherein a lateral width of a second portion of the lower electrode is greater than a lateral width of the top portion of the lower electrode, and
wherein the second portion extends in the vertical direction from the third level to the fourth level.

13. The integrated circuit device of claim 8,
wherein the lower electrode further comprises a second step portion formed at a sidewall of the lower electrode at a fourth level between the second level and the third level,
wherein a lateral width of a second portion of the lower electrode is less than a lateral width of the top portion of the lower electrode,
wherein the second portion extends in the vertical direction from the third level to the fourth level.

14. The integrated circuit device of claim 8, wherein the upper support pattern is in contact with a sidewall and the top surface of the top portion of the lower electrode and comprises a portion extending parallel to the substrate on the top surface of the top portion of the lower electrode.

15. The integrated circuit device of claim 8,
wherein the lower electrode further comprises a recessed surface and a plurality of third step portions,
wherein the recessed surface is formed at a sidewall of a partial region of a first portion of the lower electrode, the first portion extending in the vertical direction between the first level and the third level, and
wherein the plurality of third step portions define a height of the recessed surface at a sidewall of the first portion.

16. The integrated circuit device of claim 8, further comprising:
a lower support pattern configured to support the lower electrode between the first level and the third level,
wherein the lower electrode comprises a protrusion protruding toward the lower support pattern.

17. The integrated circuit device of claim 8, wherein the upper support pattern comprises a silicon nitride film, a silicon oxycarbide (SiOC) film, a silicon carbonitride (SiCN) film, a silicon boron nitride (SiBN) film, a silicon boron carbonitride (SiBCN) film, or a combination thereof.

18. An integrated circuit device comprising:
a plurality of lower electrodes spaced apart from each other on a substrate;
an upper support pattern extending in a lateral direction parallel to the substrate, the upper support pattern having a plurality of holes through which the plurality of lower electrodes pass; and
a lower support pattern extending in the lateral direction between the substrate and the upper support pattern and being in contact with each of the plurality of lower electrodes,
wherein the upper support pattern comprises a seam portion formed inside the upper support pattern at a position spaced apart from the plurality of lower electrodes in the lateral direction.

19. The integrated circuit device of claim 18,
wherein each of the plurality of lower electrodes comprises a main portion and a top portion,
wherein the main portion extends lengthwise on the substrate in a vertical direction and has a sidewall with at least one step portion,
wherein the top portion has a width less than a width of the main portion in the lateral direction, and
wherein the upper support pattern is in contact with the top portion of each of the plurality of lower electrodes.

20. The integrated circuit device of claim 18, wherein each of the plurality of lower electrodes comprises a protrusion protruding toward the lower support pattern.

\* \* \* \* \*